US009954095B2

(12) United States Patent
Moriya et al.

(10) Patent No.: US 9,954,095 B2
(45) Date of Patent: Apr. 24, 2018

(54) SEMICONDUCTOR DEVICE AND METHOD OF MANUFACTURING SAME

(71) Applicant: Renesas Electronics Corporation, Koutou-ku, Tokyo (JP)

(72) Inventors: Taro Moriya, Ibaraki (JP); Hiroyoshi Kudou, Ibaraki (JP); Satoshi Uchiya, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/401,095

(22) Filed: Jan. 8, 2017

(65) Prior Publication Data
US 2017/0263753 A1    Sep. 14, 2017

(30) Foreign Application Priority Data
Mar. 11, 2016  (JP) .................................. 2016-048763

(51) Int. Cl.
*H01L 29/66* (2006.01)
*H01L 29/45* (2006.01)
(Continued)

(52) U.S. Cl.
CPC .... *H01L 29/7813* (2013.01); *H01L 21/76897* (2013.01); *H01L 23/5283* (2013.01); *H01L 29/1095* (2013.01); *H01L 29/4236* (2013.01); *H01L 29/456* (2013.01); *H01L 29/66734* (2013.01)

(58) Field of Classification Search
CPC ............. H01L 29/1095; H01L 29/7813; H01L 29/66734; H01L 29/456; H01L 29/4236; H01L 23/5283; H01L 21/76897
See application file for complete search history.

(56) References Cited

U.S. PATENT DOCUMENTS 5,998,833 A    12/1999  Baliga
7,948,031 B2 *  5/2011  Otake ................. H01L 29/0615
                                                  257/330
(Continued)

FOREIGN PATENT DOCUMENTS

JP          2009-260271 A    11/2009

*Primary Examiner* — Jarrett Stark
*Assistant Examiner* — Charles N Ausar-El
(74) *Attorney, Agent, or Firm* — Shapiro, Gabor and Rosenberger, PLLC

(57) ABSTRACT

To provide a semiconductor device less affected by noise without making a manufacturing process more complicated and increasing a chip area. The device has a semiconductor substrate having first and second surfaces, a first-conductivity-type drain region on the second surface side in the semiconductor substrate, a first-conductivity-type drift region on the first surface side of a substrate region, a second-conductivity-type base region on the first surface side of the drift region, a first-conductivity-type source region on the first surface of the semiconductor substrate sandwiching a base region between the source and drift regions, a gate electrode opposite to and insulated from the base region, a wiring on the first main surface electrically coupled to the source region, and a first conductive film on the first main surface, opposite to and insulated from the wiring, and electrically coupled to the substrate region.

19 Claims, 30 Drawing Sheets

(51) Int. Cl.
*H01L 29/423* (2006.01)
*H01L 29/10* (2006.01)
*H01L 23/528* (2006.01)
*H01L 21/768* (2006.01)
*H01L 29/78* (2006.01)

(56) References Cited

U.S. PATENT DOCUMENTS

| | | | |
|---|---|---|---|
| 8,193,579 B2 * | 6/2012 | Yoshimochi | H01L 29/7813 257/331 |
| 8,258,555 B2 * | 9/2012 | Lin | H01L 29/66727 257/288 |
| 8,362,529 B2 * | 1/2013 | Lin | H01L 29/739 257/288 |
| 8,410,546 B2 | 4/2013 | Kawaguchi et al. | |
| 8,829,604 B2 * | 9/2014 | Okaji | H01L 21/823487 257/244 |
| 9,142,555 B2 * | 9/2015 | Yoshida | H01L 24/37 |
| 9,219,145 B2 * | 12/2015 | Iguchi | H01L 29/7813 |
| 9,331,071 B2 * | 5/2016 | Sunamura | H01L 27/1225 |
| 9,515,153 B2 * | 12/2016 | Uchimura | H01L 21/26513 |
| 2003/0178676 A1 * | 9/2003 | Henninger | H01L 29/402 257/340 |
| 2006/0214221 A1 * | 9/2006 | Challa | H01L 21/3065 257/328 |
| 2011/0316075 A1 * | 12/2011 | Hsieh | H01L 29/66825 257/330 |
| 2012/0049263 A1 * | 3/2012 | Lin | H01L 29/66727 257/306 |
| 2014/0145258 A1 * | 5/2014 | Lin | H01L 29/7827 257/330 |
| 2015/0380480 A1 * | 12/2015 | Ozawa | H01L 27/10855 257/296 |

* cited by examiner

SEMICONDUCTOR DEVICE AND METHOD OF MANUFACTURING SAME

CROSS-REFERENCE TO RELATED APPLICATIONS

The disclosure of Japanese Patent Application No. 2016-048763 filed on Mar. 11, 2016 including the specification, drawings, and abstract is incorporated herein by reference in its entirety.

BACKGROUND

The present invention relates to a semiconductor device and a method of manufacturing same.

As a power semiconductor device, for example, a trench gate type vertical MOSFET (metal oxide semiconductor field effect transistor) has conventionally been known.

When a noise occurs in such a trench gate type vertical MOSFET, the noise passes through a junction capacitance of a pn junction formed between its drift region and base region. A noise having a low frequency, however, increases the impedance of this junction capacitance. This causes the problem that the noise cannot easily pass through this junction capacitance.

As a semiconductor device capable of overcoming this problem, proposed are the semiconductor device described in Patent Document 1 (Japanese Unexamined Patent Application Publication No. 2009-260271) and the semiconductor device described in Patent Document 2 (U.S. Pat. No. 5,998,833).

The semiconductor substrate of the semiconductor device described in Patent Document 1 has a trench MOS region in which a trench type vertical MOSFET is to be formed and a capacitance formation region. In the capacitance formation region, the semiconductor substrate has a trench extending from the main surface to the back surface in the drift region, an insulating film formed on the surface of the trench, and a conductive film formed on an insulator film. The conductive film has a source potential. Therefore, the conductive film and the drift region have therebetween a source-drain capacitance.

The semiconductor device described in Patent Document 2 has, in the semiconductor substrate, a gate electrode insulated from and opposite to a portion of a base region sandwiched between a source region and a drift region and a conductive film insulated from and opposite to the drift region. The gate electrode and the conductive film are in a trench extending from the main surface of the semiconductor substrate to the back surface side thereof. The conductive film has a source potential and is placed on the side of the back surface relative to the gate electrode. A source-drain capacitance is therefore formed between the conductive film and the drift region.

PATENT DOCUMENTS

[Patent Document 1] Japanese Unexamined Patent Application Publication No. 2009-260271
[Patent Document 2] U.S. Pat. No. 5,998,833

SUMMARY

In the semiconductor devices described in Patent Document 1 and Patent Document 2, an influence of a noise is reduced because of an additional capacitance formed between a source and a drain. The semiconductor device described in Patent Document 1, however, has the problem that a chip area increases.

In the semiconductor device described in Patent Document 2, in contrast, formation of a trench having a depth greater than that of a conventional trench gate type vertical MOSFET is necessary. This leads to the problem that the manufacturing process becomes complicated from the standpoint of formation of an insulating film in the trench and necessity of two or more times of etching.

Another problem and novel features will be apparent from the description herein and accompanying drawings.

A semiconductor device according to one embodiment has a semiconductor substrate having a first surface and a second surface which is a surface on the side opposite to the first surface.

The semiconductor substrate has a drain region placed on the side of the second surface and having a first conductivity type, a drift region placed on the side of the main surface relative to a substrate region and having the first conductivity type, a base region placed on the side of the main surface relative to the drift region and having a second conductivity type, and a source region contiguous to the main surface and sandwiching the base region between the source region and the drift region.

The semiconductor device according to the one embodiment further has a gate electrode, a wiring, and a first conductive film. The gate electrode is opposite to the base region sandwiched between the source region and the drift region, while being insulated from the base region. The wiring is placed on the first surface and is electrically coupled to the source region. The first conductive film is electrically coupled to the drain region. The first conductive film is placed on the first surface and is opposite to the wiring while being insulated therefrom.

The semiconductor device according to the one embodiment can be less influenced by a noise without complicating the manufacturing process and increasing a chip area.

DETAILED DESCRIPTION

Figure 1:
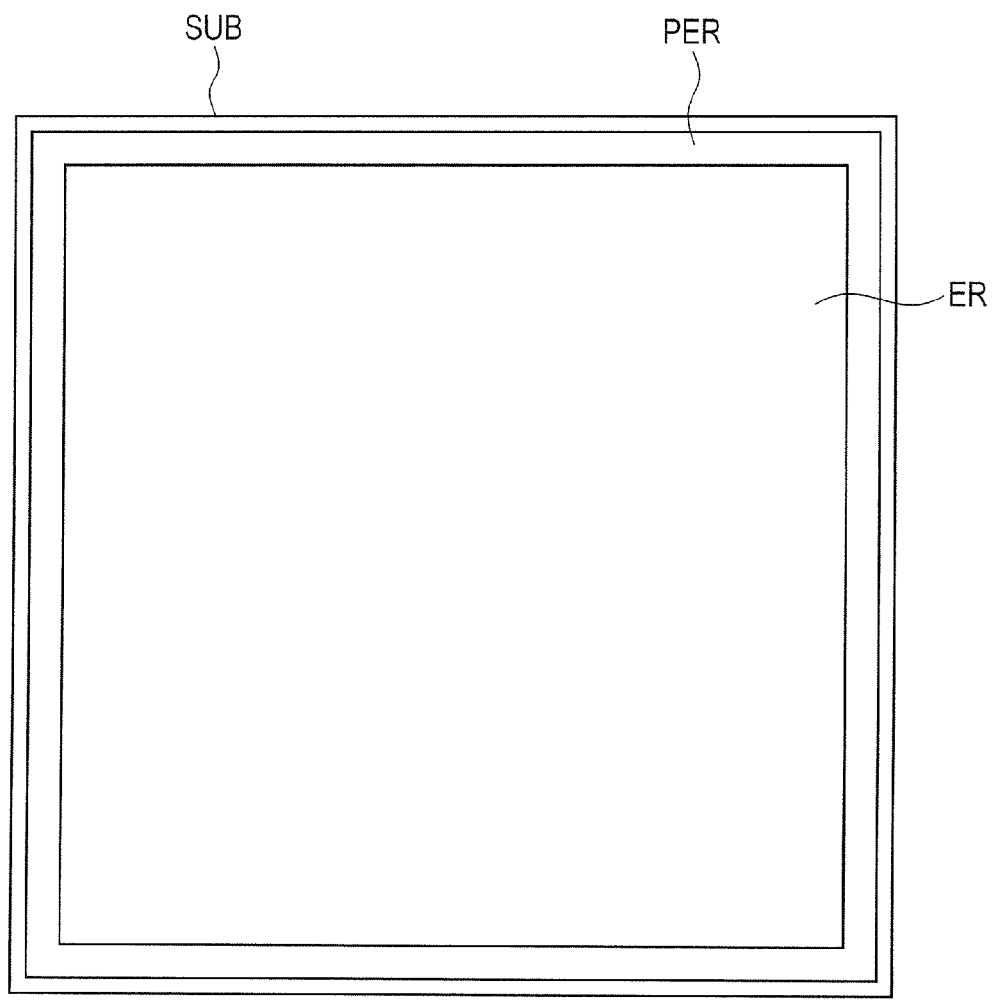
FIG. 1 is a top view showing the overall structure of a semiconductor device of First Embodiment.

Embodiments will hereinafter be described referring to the above drawings. In each drawing, the same portion or a portion corresponding thereto is identified by the same reference numeral. At least a portion of the embodiments described below may be used in any combination.

First Embodiment

The constitution of the semiconductor device of First Embodiment will hereinafter be described.

The semiconductor device of First Embodiment is, for example, a trench gate type vertical MOSFET.

As FIG. 1 shows, the semiconductor device of First Embodiment has a semiconductor substrate SUB. The semiconductor substrate SUB is made of, for example, a single silicon (Si) crystal. The semiconductor device of First Embodiment has an element region ER and a peripheral region PER. In the element region ER, a MOSFET is formed in the semiconductor substrate SUB. The peripheral region PER is located at the periphery of the semiconductor device of First Embodiment.

Figure 2:
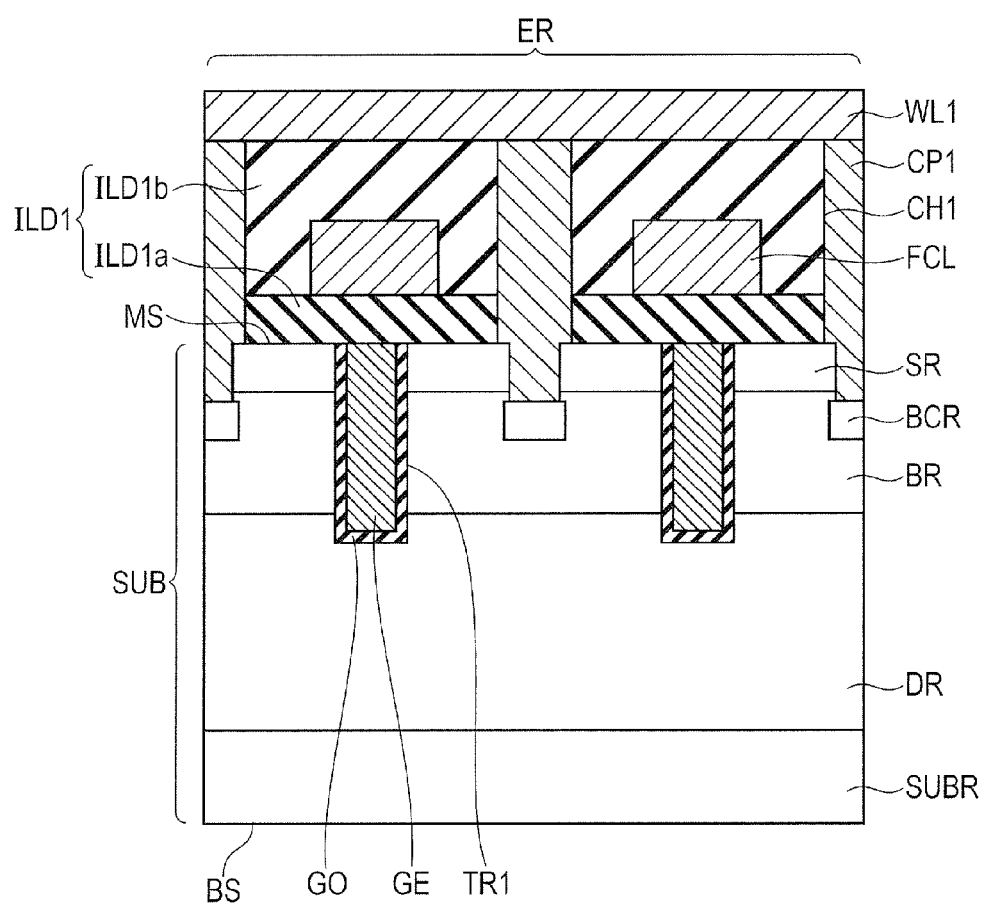
FIG. 2 is a cross-sectional view, in an element region, of the semiconductor device of First Embodiment.

As FIG. 2 shows, the semiconductor substrate SUB has a main surface (first surface) MS and a back surface (second surface) BS. The back surface BS is a surface on the side opposite to the main surface MS. The semiconductor substrate SUB has, in the element region ER, a substrate region SUBR, a drift region DR, a base region BR, and a source region SR. The semiconductor substrate SUB may have a base contact region BCR in the element region ER.

The substrate region SUBR is on the side of the back surface BS of the semiconductor substrate SUB. The substrate region SUBR has an n conductivity type. The substrate region SUBR serves as a drain region of the MOSFET.

The drift region DR is on the main surface MS side of the substrate region SUBR. The drift region DR has an n conductivity type. The drift region DR preferably has an n type impurity concentration lower than that of the substrate region SUBR.

The base region BR is on the main surface MS side of the drift region DR. The base region BR has a p conductivity type.

The source region SR is contiguous to the main surface MS while having the base region BR between the source region SR and the drift region DR. The source region SR has an n conductivity type. A base contact region BCR is in the base region BR. The base contact region BCR has a p conductivity type.

The semiconductor device of First Embodiment further has, in the element region ER, a gate electrode GE. The gate electrode GE is opposite to the base region BR sandwiched between the source region SR and the drift region DR while being insulated from the base region BR. The gate electrode GE is made of, for example, doped polycrystalline Si.

The semiconductor substrate SUB has, in the element region ER, a trench TR1 and a gate insulating film GO. The trench TR1 extends from the main surface MS to the back surface BS. More specifically, the trench TR1 penetrates the source region SR and the base region BR and reaches the drift region DR. The gate electrode GE fills the trench TR1 therewith. The gate insulating film GO is present between the trench TR and the gate electrode GE. The gate insulating film GO is made of, for example, silicon dioxide ($SiO_2$). The gate electrode GE is therefore opposite to the base region BR sandwiched between the source region SR and the drift region DR while being insulated from the base region BR.

The semiconductor device of First Embodiment further has, in the element region ER, a wiring WL1. The wiring WL1 is electrically coupled to the source region SR. The wiring WL1 is electrically coupled to the source region SR via a contact plug CP1. The contact plug CP1 is coupled also to the base contact region BCR. The wiring WL1 is made of, for example, aluminum (Al) or an Al alloy. The contact plug CP1 is made of, for example, tungsten (W).

The semiconductor device of First Embodiment further has a first conductive film FCL. The first conductive film FCL is, in the element region ER, opposite to the wiring WL1 while being insulated therefrom. The first conductive film FCL is electrically coupled to the drain region (that is, the substrate region SUBR). Electrical coupling between the first conductive film FCL and the drain region will be described later. The first conductive film FCL is made of, for example, doped polycrystalline Si.

The semiconductor device of First Embodiment has an interlayer insulating film ILD1. The interlayer insulating film ILD1 is sandwiched between the main surface MS and the wiring WL1. The interlayer insulating film ILD1 has a lower interlayer insulating film ILD1a and an upper interlayer insulating film ILD1b. The lower interlayer insulating film ILD1a is a lower side (side near the main surface MS) portion of the interlayer insulating film ILD1. The upper interlayer insulating film ILD1b is an upper side (side distant from the main surface MS) portion of the interlayer insulating film ILD1. The lower interlayer insulating film ILD1a is made of, for example, HTO (high temperature oxide). The upper interlayer insulating film ILD1b is made of, for example, HTO or BPSG (boron phosphorous silicon glass).

The interlayer insulating film ILD1 has therein a contact hole CH1. The contact hole CH1 is at a position corresponding to the source region SR. The contact hole CH1 is filled with the contact plug CP1.

The first conductive film FCL is in the interlayer insulating film ILD1. This means that the first conductive film FCL is sandwiched between the lower interlayer insulating film ILD1a and the upper interlayer insulating film ILD1b. The first conductive film FCL is therefore opposite to the wiring WL1 while being insulated therefrom in the element region ER. In this case, the first conductive film FCL is also opposite to the contact plug CP1 while being insulated therefrom. As described above, the first conductive film FCL is electrically coupled to the drain region. The capacitance formed between the first conductive film FCL and the wiring WL1 (and the contact plug CP1) therefore corresponds to a source-drain capacitance.

Figure 3:
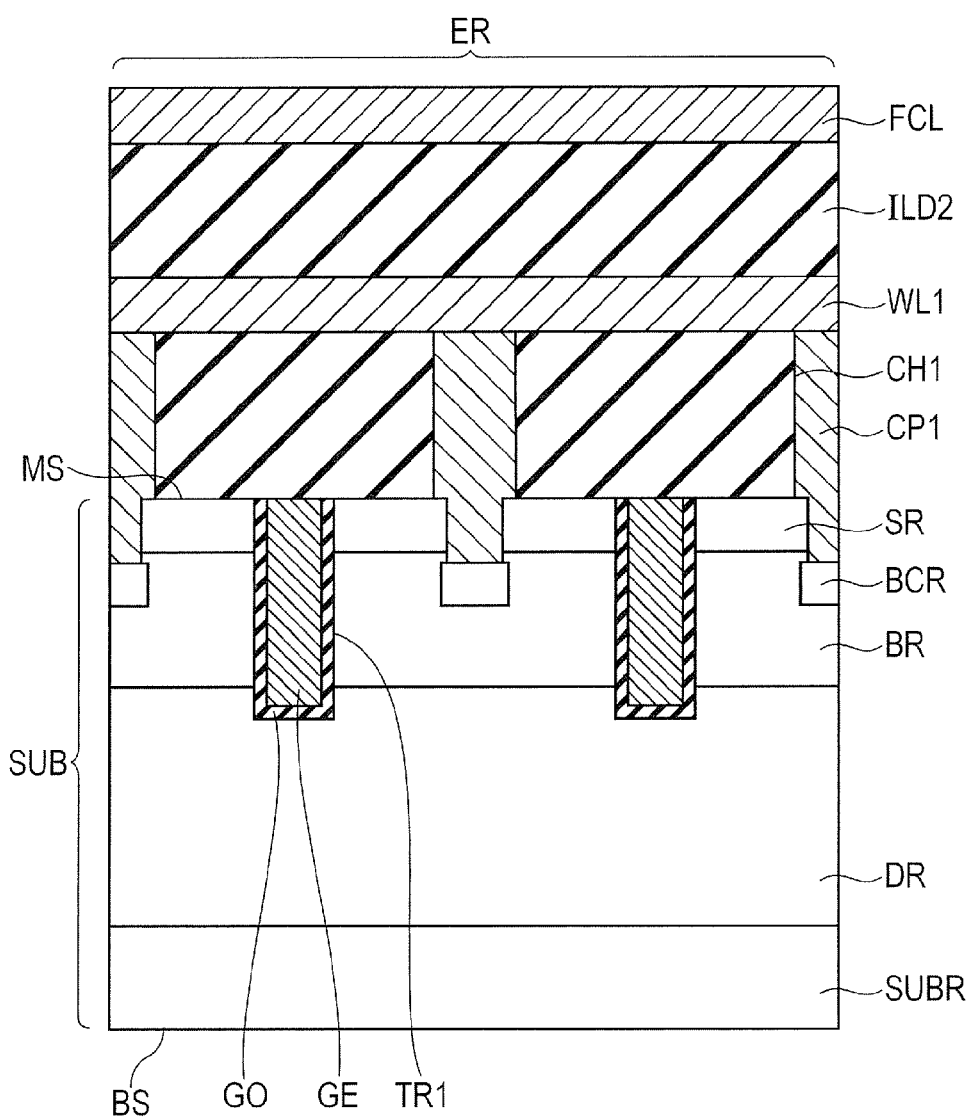
FIG. 3 is a cross-sectional view, in an element region, of a semiconductor device of First Modification Example of First Embodiment.

The position of the first conductive film FCL is not limited to that described above. As FIG. 3 shows, the semiconductor device of First Embodiment may further have, on the wiring WL1, an interlayer insulating film ILD2. The first conductive film FCL may be formed on this interlayer insulating film ILD2. In such a constitution, the first conductive film FCL can be, in the element region ER, made opposite to the wiring WL1 while being insulated therefrom.

Figure 4:
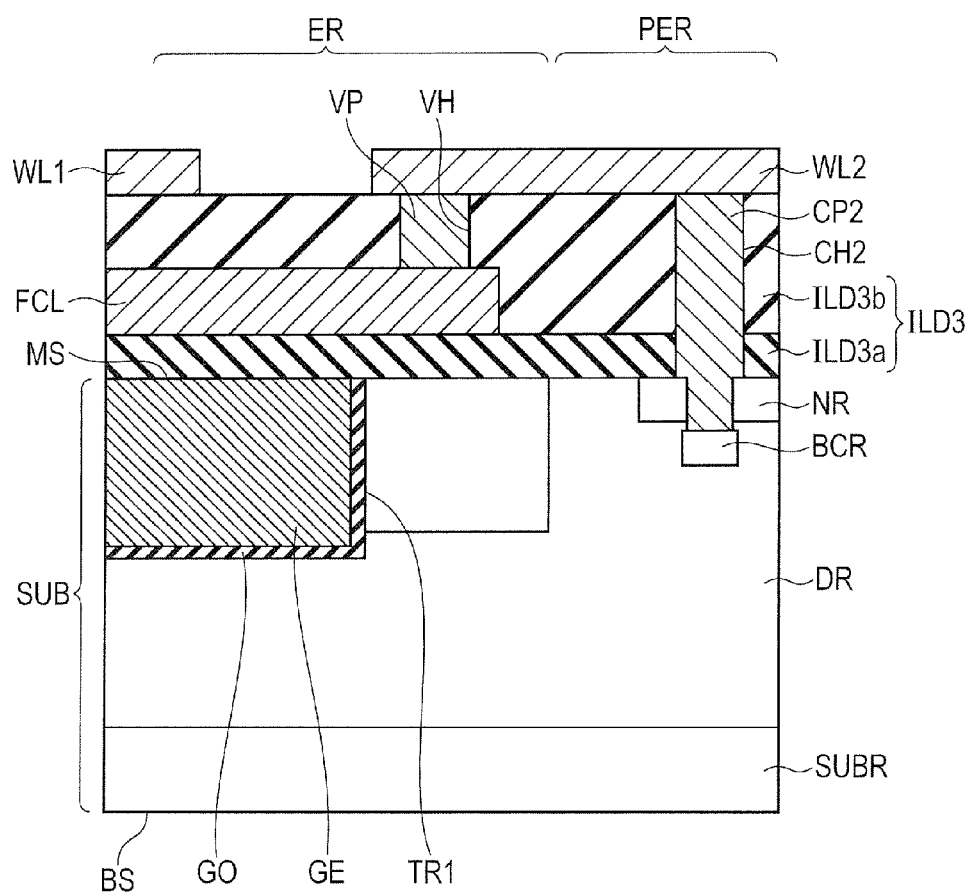
FIG. 4 is a cross-sectional view, in a peripheral region, of the semiconductor device of First Embodiment.

As FIG. 4 shows, the semiconductor substrate SUB has, in the peripheral region PER, a substrate region SUBR, a drift region DR, and an n type impurity region NR. The semiconductor substrate SUB may have, in the peripheral region PER, a base contact region BCR. The semiconductor device of First Embodiment has, in the peripheral region PER, a wiring WL2, an interlayer insulating film ILD3, and a contact plug CP2.

The interlayer insulating film ILD3 is on the main surface MS of the semiconductor substrate SUB. The interlayer insulating film ILD3 has a lower interlayer insulating film ILD3a and an upper interlayer insulating film ILD3b. The lower interlayer insulating film ILD3a is a lower side (side near the main surface MS) portion of the interlayer insulating film ILD3. The upper interlayer insulating film ILD3b is an upper side (side distant from the main surface MS) portion of the interlayer insulating film ILD3. The lower interlayer insulating film ILD3a is made of, for example, HTO (high temperature oxide). The upper interlayer insulating film ILD3b is made of, for example, HTO or BPSG (boron phosphorous silicon glass).

The wiring WL2 is on the interlayer insulating film ILD3. The contact plug CP2 fills a contact hole CH2 formed in the interlayer insulating film ILD3. The contact hole CH2 is provided at a position corresponding to the n type impurity region NR.

The wiring WL2 is coupled to one of the ends of the contact plug CP2. The other end of the contact plug CP2 is coupled to the n type impurity region NR and the base contact region BCR. The wiring WL2 is therefore electrically coupled to the n type impurity region NR via the contact plug CP2.

The n type impurity region NR, the drift region DR, and the substrate region SUBR each have an n conductivity type. The wiring WL2 is therefore electrically coupled to the substrate region SUBR (that is, the drain region). The wiring WL2 is coupled to the first conductive film FCL via a via plug VP. The first conductive film FCL is therefore electrically coupled to the drain region.

Figure 5A:
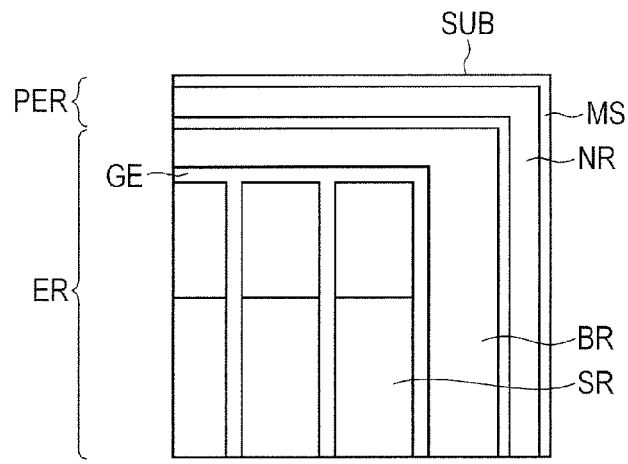
FIGS. 5A, 5B, and 5C are each a top view in the vicinity of a boundary, of the semiconductor device of First Embodiment, between the element region and the peripheral region.

FIG. 5A is a top view of the semiconductor substrate SUB in the vicinity of the boundary between the element region ER and the peripheral region PER. As FIG. 5A shows, the semiconductor substrate SUB has, on the side of the main surface MS thereof, the base region BR, the source region SR, the n type impurity region NR, and the gate electrode GE.

The n type impurity region NR continuously surrounds, in the peripheral region PER, the element region ER.

The base region BR extends all over the element region ER. The gate electrode GE has a comb-like shape in a region having therein the base region BR. The source region SR is sandwiched between any two of the gate electrodes GE.

Figure 5B:
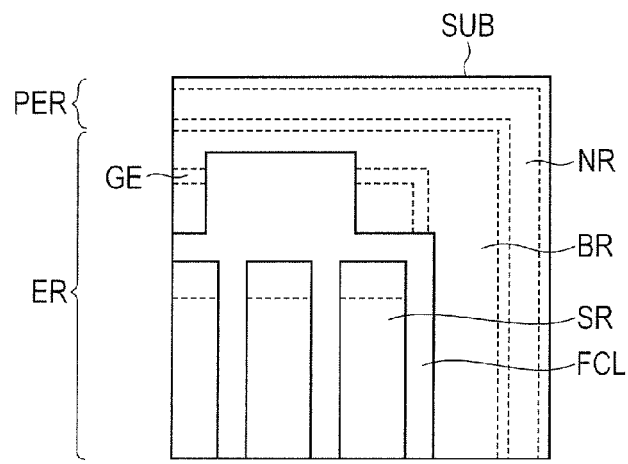

FIG. 5B is a top view of the first conductive film FCL in the vicinity of the boundary between the element region ER and the peripheral region PER. In FIG. 5B, the base region BR, the source region SR, the n type impurity region NR, and the gate electrode GE are indicated by a dotted line. As FIG. 5B shows, the first conductive film FCL has a comb-like shape in the element region ER. The first conductive film FCL overlaps, in plan view (that is, viewed from a direction perpendicular to the main surface MS) with a region where the gate electrode GE is to be formed.

Figure 5C:
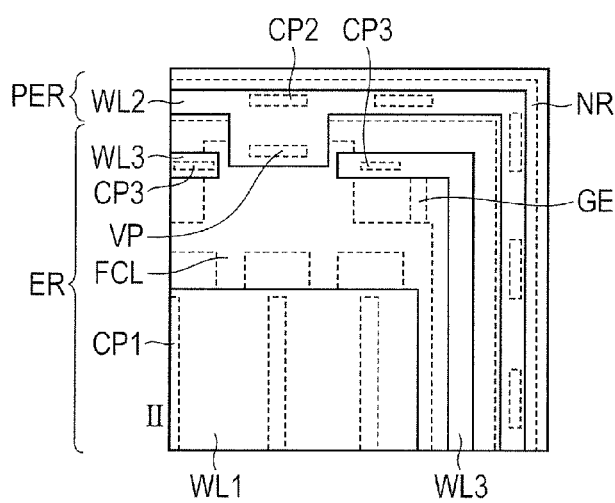

FIG. 5C is a top view of the wiring WL1, a wiring WL2, and a wiring WL3 in the vicinity of the boundary between the element region ER and the peripheral region PER. In FIG. 5C, the base region BR, the source region SR, the n type impurity region NR, the gate electrode GE, and the first conductive film FCL are indicated by a dotted line. As FIG. 5C shows, the wiring WL1 overlaps with a region having therein the source region SR in the element region ER. The wiring WL1 is coupled to the source region SR and the base contact region BCR via the contact plug CP1.

The wiring WL2 overlaps, in plan view, with the n type impurity region NR in the peripheral region PER. In addition, the wiring WL2 overlaps, in plan view, with the first conductive film FCL in the element region ER.

A portion of the wiring WL2 formed in the peripheral region PER is coupled to the n type impurity region NR via a contact plug CP2. A portion of the wiring WL2 that overlaps with the first conductive film FCL is coupled to the first conductive film FCL via the via plug VP.

The wiring WL3 overlaps, in plan view, with the gate electrode GE in the element region ER. The wiring WL3 is coupled to the gate electrode GE via a contact plug CP3.

Although not illustrated in the drawing, the wiring WL1 is coupled to a source electrode pad, while the wiring WL3 is coupled to a gate electrode pad.

The above-described semiconductor device of First Embodiment is a trench gate type vertical MOSFET. The semiconductor device of First Embodiment is not limited to a trench gate type vertical MOSFET. The semiconductor device of First Embodiment may be a vertical MOSFET which is not a trench gate type.

Figure 6A:
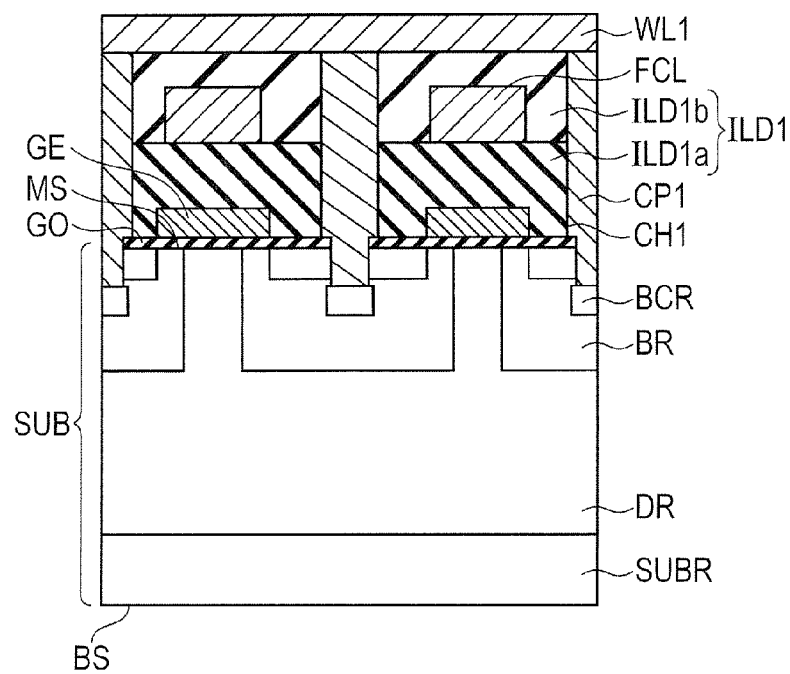
FIGS. 6A and 6B are each a cross-sectional view, in an element region, of a semiconductor device of Second Modification Example of First Embodiment.

As FIG. 6A shows, when the semiconductor device of First Embodiment is a vertical MOSFET which is not a trench gate type, a semiconductor substrate SUB has, in an element region ER, a substrate region SUBR, a drift region DR, a base region BR, and a source region SR. The semiconductor substrate SUB may have, in the element region ER, a base contact region BCR. In this case, the semiconductor device of First Embodiment has a gate electrode GE and a gate insulating film GO.

On the main surface MS, the base region BR has a portion sandwiched between the source region SR and the drift region DR. The portion of the base region BR sandwiched between the source region SR and the drift region DR has thereon a gate insulating film GO. The gate insulating film GO has thereon a gate electrode GE that overlaps, in plan view, with the portion of the base region BR sandwiched between the source region SR and the drift region DR. The gate electrode GE is therefore opposite to the base region BR sandwiched between the source region SR and the drift region DR while being insulated from the base region BR.

The semiconductor device of First Embodiment which is a vertical MOSFET not a trench gate type does not have a trench TR1, which is a difference from the semiconductor device of First Embodiment which is a trench gate type vertical MOSFET. They are, however, similar to each other in that the gate electrode GE is opposite to the base region BR sandwiched between the source region SR and the drift region DR while being insulated therefrom. The semiconductor device of First Embodiment, therefore, may be a vertical MOSFET not a trench gate type.

Figure 6B:
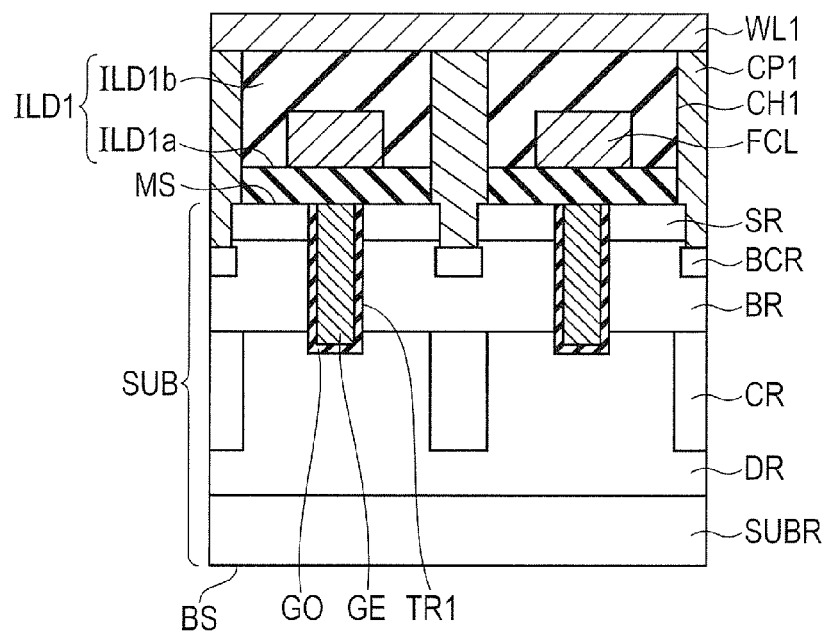

As FIG. 6B shows, the semiconductor device of First Embodiment may have a column region CR. This means that the semiconductor device of First Embodiment may have a superjunction structure. When the semiconductor substrate SUB has therein the column region CR, the drift region DR preferably has an n type impurity concentration higher than that of the semiconductor substrate having no column region CR. The semiconductor device of First Embodiment can therefore have a reduced ON resistance while maintaining a withstand voltage.

The column region CR extends from the base region BR to the side of the back surface BS. The base region BR has a p conductivity type. The column region CR forms a pn junction between the column region CR and the drift region DR and thereby extends a depletion layer in a lateral direction (a direction perpendicular to a direction extending from the main surface MS to the back surface BS). As a result, the semiconductor device of First Embodiment can have an improved withstand voltage. The p type impurity concentration in the column region CR is selected as needed so as to keep a charge balance between the column region CR and the drift region DR.

A method of manufacturing the semiconductor device of First Embodiment will hereinafter be described.

The method of manufacturing the semiconductor device of First Embodiment has a front end step S1 and a back end step S2.

Figure 7A:
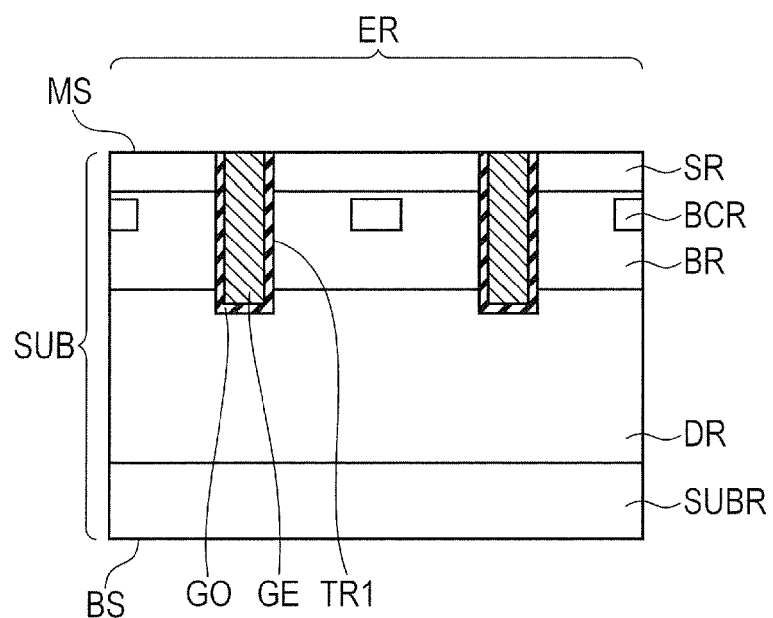
FIGS. 7A and 7B are each a cross-sectional view of the semiconductor device of First Embodiment during a front-end step.

FIG. 7A is a cross-sectional view, in the element region ER, of the semiconductor device of First Embodiment during the front end step S1. In the front end step S1, as FIG. 7A shows, a substrate region SUBR, a drift region DR, a base region BR, a source region SR, a base contact region BCR, a trench TR1, a gate electrode GE, and a gate insulating film GO are formed in the element region ER of the semiconductor substrate SUB.

Figure 7B:
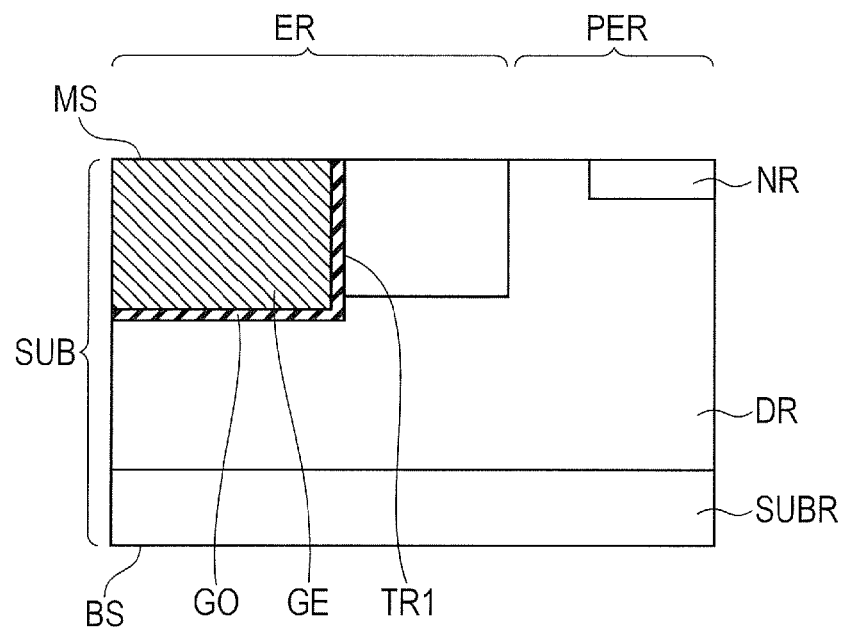

FIG. 7B is a cross-sectional view, in the peripheral region PER, of the semiconductor device of First Embodiment during the front end step S1. In the front end step S1, as FIG. 7B shows, a substrate region SUBR, a drift region DR, and an n type impurity region NR are formed in the peripheral region PER of the semiconductor substrate SUB. The front end step S1 is performed by an ordinarily employed semiconductor manufacturing process.

The back end step S2 has a conductive film formation step S21 and a wiring step S22. The conductive film formation step S21 has a first insulating film formation step S211, a first conductive film formation step S212, and a second insulating film formation step S213.

Figure 8A:
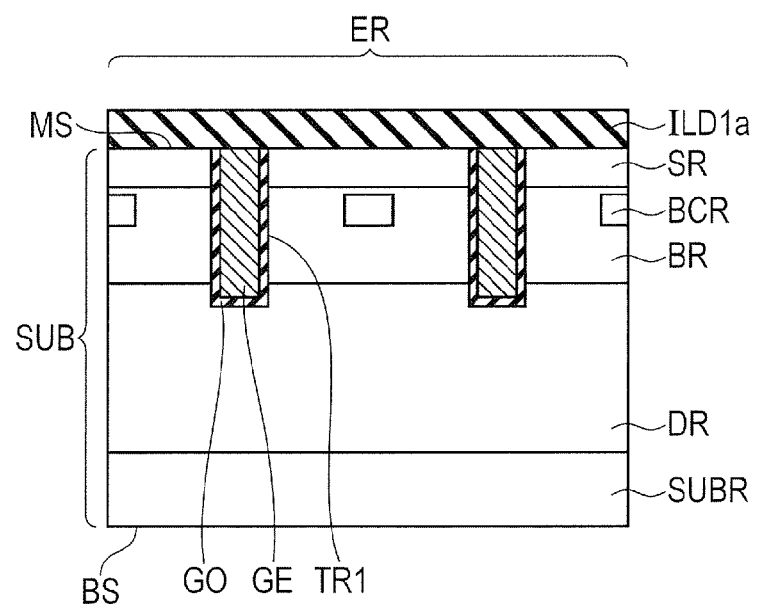
FIGS. 8A and 8B are each a cross-sectional view of the semiconductor device of First Embodiment during a first insulating film growing step.
Figure 8B:
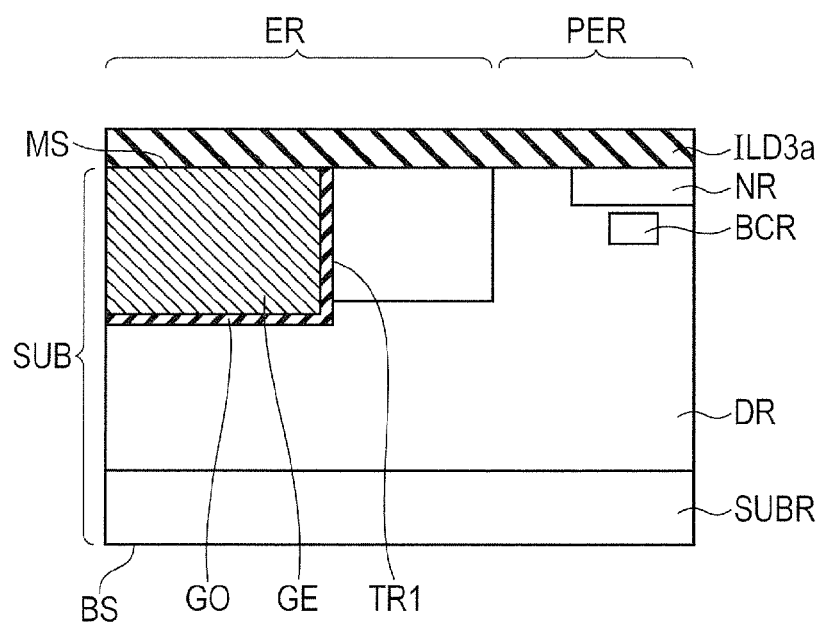

FIG. 8A is a cross-sectional view, in the element region ER, of the semiconductor device of First Embodiment during the first insulating film formation step S211. FIG. 8B is a cross-sectional view, in the peripheral region PER, of the semiconductor device of First Embodiment during the first insulating film formation step S211.

As FIGS. 8A and 8B show, in the first insulating film formation step S211, a lower interlayer insulating film ILD1a and a lower interlayer insulating film ILD3a are formed on the main surface MS located in the element region ER and the peripheral region PER, respectively. The first insulating film formation step S211 is performed, for example, by growing HTO by using CVD (chemical vapor deposition).

Figure 9:
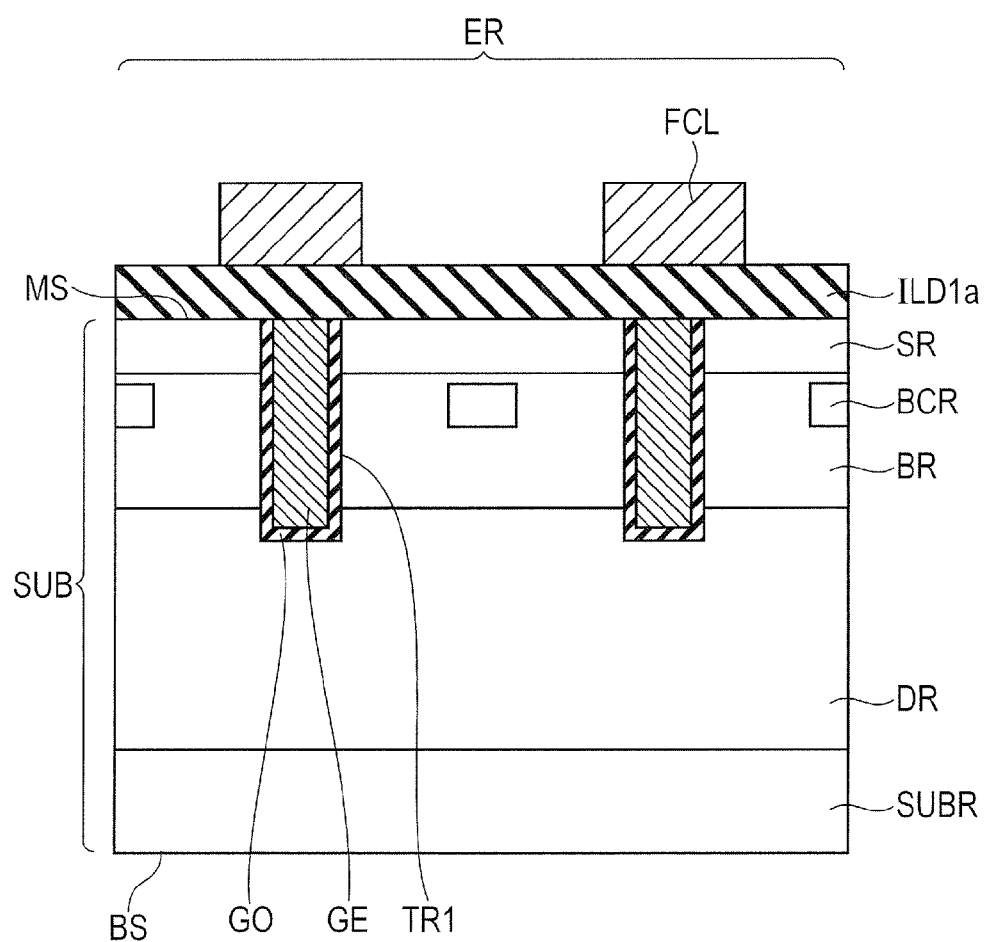
FIG. 9 is a cross-sectional view, in the element region, of the semiconductor device of First Embodiment during a first conductive film formation step.

As FIG. 9 shows, in the first conductive film formation step S212, a first conductive film FCL is formed on the lower interlayer insulating film ILD1a. The first conductive film formation step S212 is performed, for example, by forming a polycrystalline Si film by CVD and patterning the resulting polycrystalline silicon film by photolithography and etching.

No change in the structure of the peripheral region PER occurs in the first conductive film formation step S212 because the first conductive film FCL is not formed in the peripheral region PER. The cross-section, in the peripheral region PER, of the semiconductor device of First Embodiment during the first conductive film formation step S212 is therefore not shown.

Figure 10A:
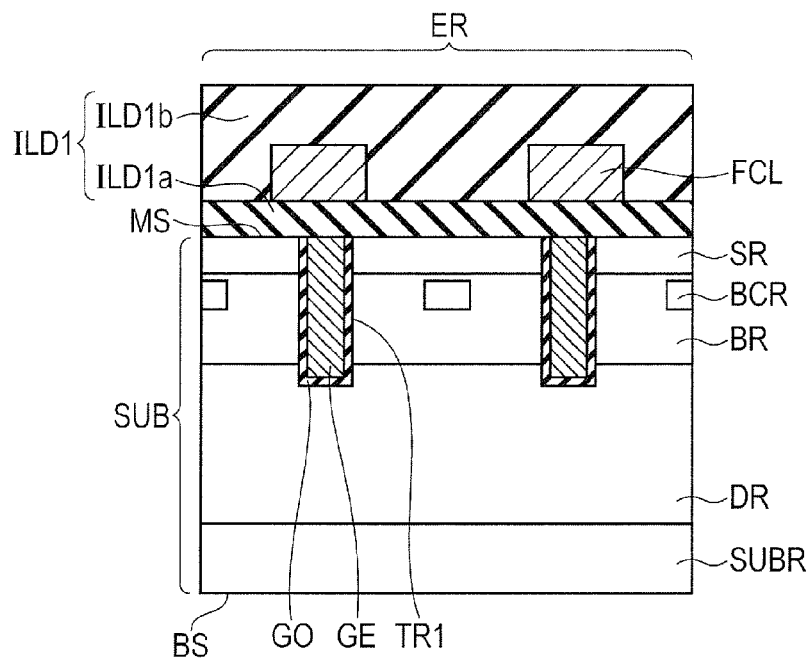
FIGS. 10A and 10B are each a cross-sectional view of the semiconductor device of First Embodiment during a second insulating film growth step.
Figure 10B:
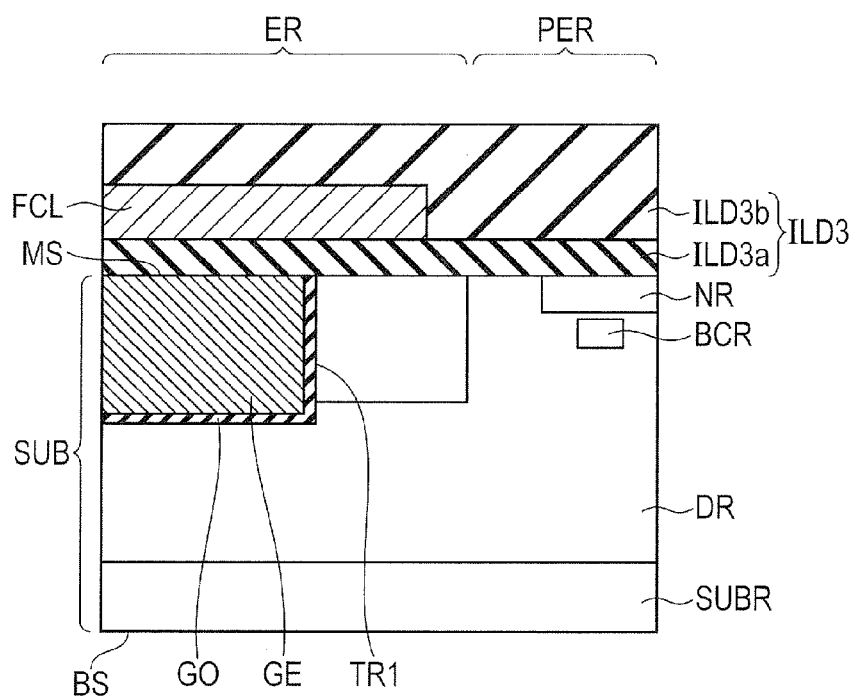

FIG. 10A is a cross-sectional view, in the element region ER, of the semiconductor device of First Embodiment in the second insulating film formation step S213. FIG. 10B is a cross-sectional view, in the peripheral region PER, of the semiconductor device of First Embodiment in the second insulating film formation step S213.

As FIG. 10A shows, in the second insulating film formation step S213, an upper interlayer insulating film ILD1b is formed on the lower interlayer insulating film ILD1a and the first conductive film FCL. Further, as FIG. 10B shows, in the second insulating film formation step S213, an upper interlayer insulating film ILD3b is formed on the lower interlayer insulating film ILD3a.

The second insulating film formation step S213 is performed, for example, by forming an HTO or BPSG film by CVD and planarizing the surface of the resulting film by CMP (chemical mechanical polishing).

The wiring step S22 includes a contact hole formation step S221, a contact plug formation step S222, and a wiring patterning step S223.

Figure 11A:
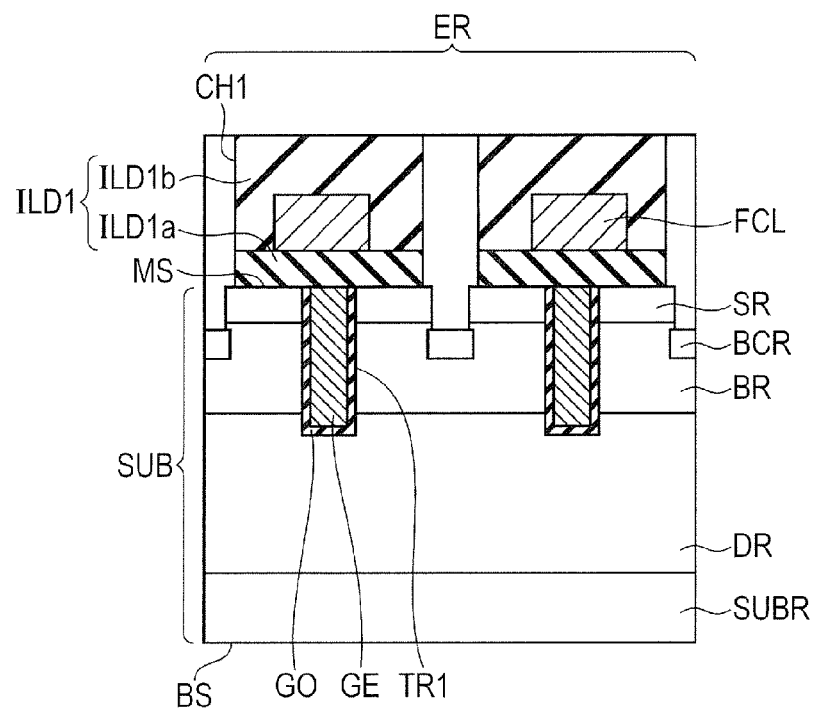
FIGS. 11A and 11B are each a cross-sectional view of the semiconductor device of First Embodiment in a contact hole formation step.

FIG. 11A is a cross-sectional view, in the element region ER, of the semiconductor device of First Embodiment during the contact hole formation step S221. As FIG. 11A shows, in the contact hole formation step S221, a contact hole CH1 is formed. By this step, the source region SR and the base contact region BCR are exposed from the interlayer insulating film ILD1.

In the contact hole formation step S221, in the element region ER, a via hole VH is formed in the interlayer insulating film ILD1 located on the first conductive film FCL. By this step, the first conductive film FCL is exposed from the interlayer insulating film ILD1.

Figure 11B:
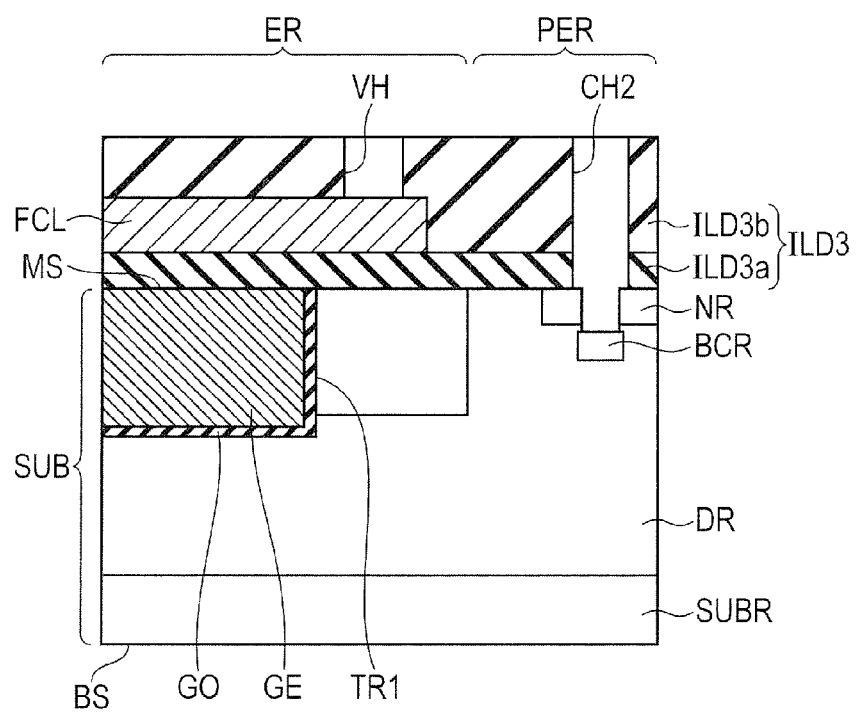

FIG. 11B is a cross-sectional view, in the peripheral region PER, of the semiconductor device of First Embodiment during the contact hole formation step S221. As FIG. 11B shows, in the contact hole formation step S221, a contact hole CH2 is formed in the interlayer insulating film ILD3. By this step, the n type impurity region NR and the base contact region BCR are exposed from the interlayer insulating film ILD3.

The contact hole formation step S221 is performed, for example, by anisotropic etching such as RIE (reactive ion etching).

Figure 12A:
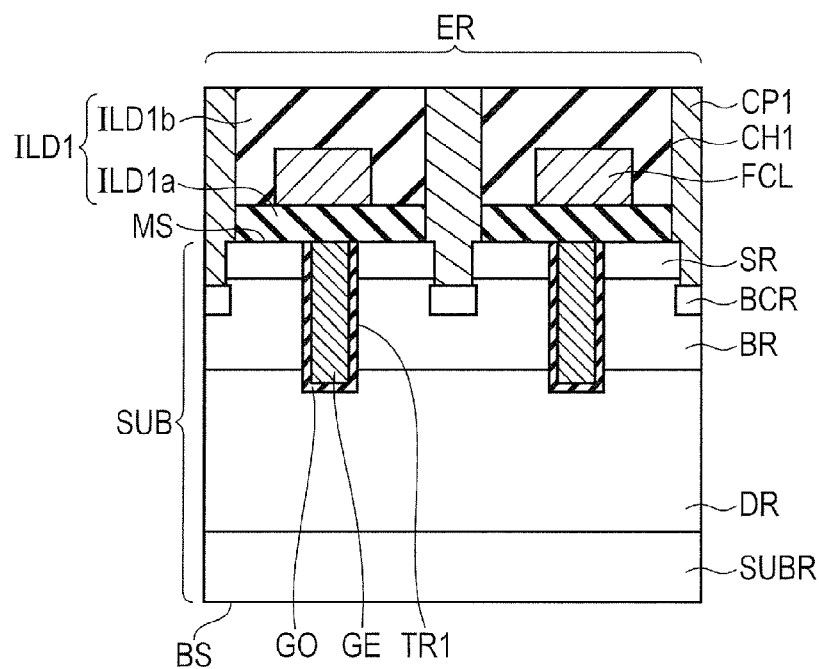
FIGS. 12A and 12B are each a cross-sectional view of the semiconductor device of First Embodiment during a contact plug formation step.

FIG. 12A is a cross-sectional view, in the element region ER, of the semiconductor device of First Embodiment during the contact plug formation step S222. As FIG. 12A shows, in the contact plug formation step S222, a contact plug CP1 is formed in the contact hole CH1.

In the contact plug formation step S222, a via plug VP is formed in the via hole VH.

Figure 12B:
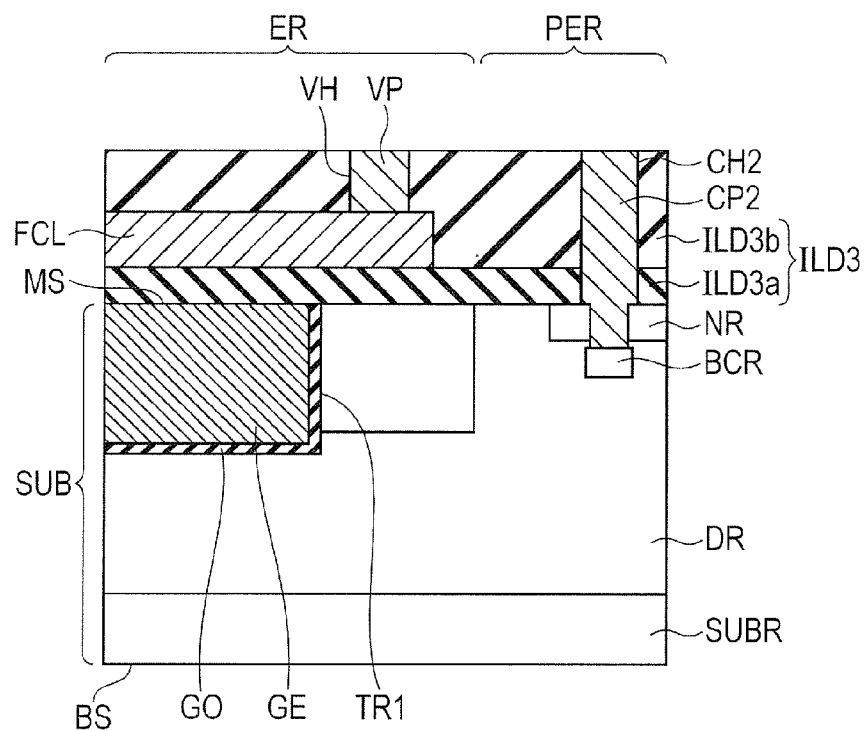

FIG. 12B is a cross-sectional view, in the peripheral region PER, of the semiconductor device of First Embodiment during the contact plug formation step S222. As FIG. 12B shows, in the contact plug formation step S222, a contact plug CP2 is formed in the contact hole CH2.

The contact plug formation step S222 is performed, for example, by filling the contact hole CH1, the contact hole CH2, and the via hole VH with W by CVD and removing a portion of W that has protruded from the contact hole CH1, the contact hole CH2, and the via hole VH by CMP.

Figure 13A:
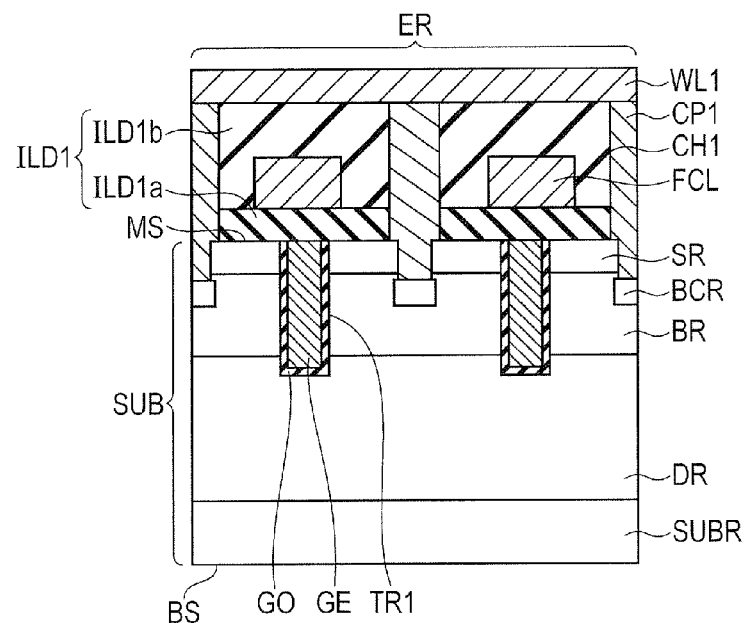
FIGS. 13A and 13B are each a cross-sectional view of the semiconductor device of First Embodiment during a wiring patterning step.

FIG. 13A is a cross-sectional view, in the element region ER, of the semiconductor device of First Embodiment during the wiring patterning step S223. As FIG. 13A shows, in the wiring patterning step S223, a wiring WL1 is formed on the interlayer insulating film ILD1.

Figure 13B:
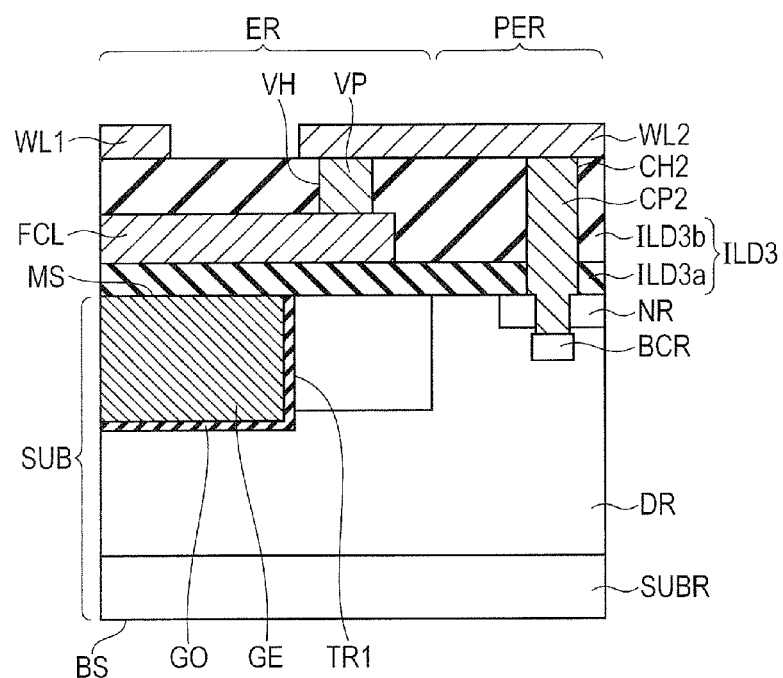

FIG. 13B is a cross-sectional view, in the peripheral region PER, of the semiconductor device of First Embodiment during the wiring patterning step S223. As FIG. 13B shows, in the wiring patterning step S223, a wiring WL2 is formed on the interlayer insulating film ILD3. The wiring WL2 extends onto a portion of the interlayer insulating film ILD1 for coupling to the via plug VP.

The wiring patterning step S223 is performed, for example, by forming an Al or Al alloy film on the interlayer insulating film ILD1 and the interlayer insulating film ILD3 by sputtering and patterning the resulting film by photolithography and etching.

The advantage of the semiconductor device of First Embodiment will next be described.

The semiconductor device of First Embodiment has the wiring WL1 on the main surface MS. The first conductive film FCL is opposite to the wiring WL1 while being insulated therefrom. An additional capacitance C1 is therefore formed between the wiring WL1 and the first conductive film FCL. This additional capacitance C1 is formed between the wiring WL1 and the first conductive film FCL so that it is located in the element formation region ER.

The wiring WL1 is electrically coupled to the source region SR. The first conductive film FCL is electrically coupled to the substrate region SUBR (drain region). The additional capacitance C1 between the wiring WL1 and the first conductive film FCL is therefore a source-drain capacitance.

Figure 14:
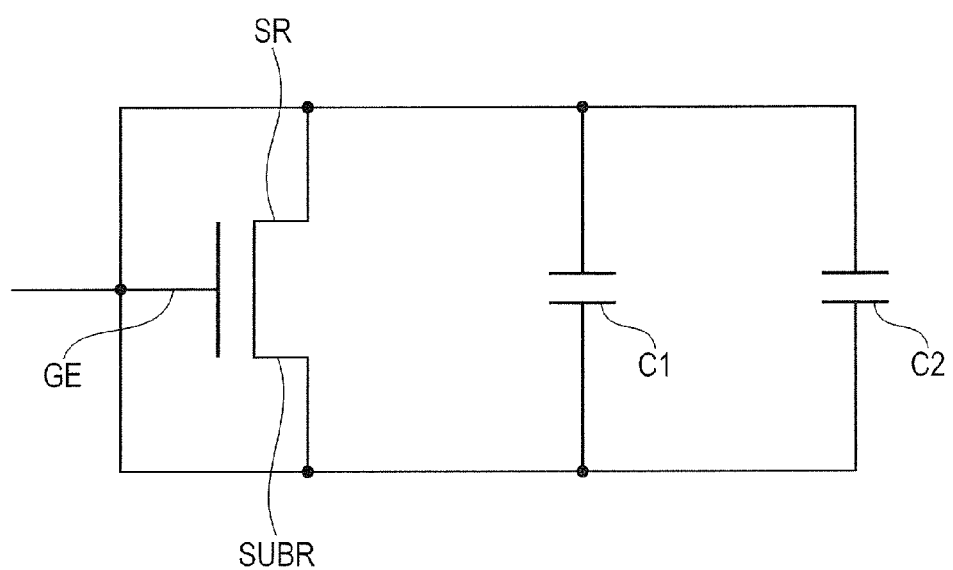
FIG. 14 is an equivalent circuit diagram of the semiconductor device of First Embodiment.

In the semiconductor device of First Embodiment, as FIG. 14 shows, the additional capacitance C1 between the wiring WL1 and the first conductive film FCL and a junction capacitance C2 between the base region BR and the drift region DR are coupled in parallel to each other between the source and the drain. The semiconductor device of First Embodiment is therefore be less affected by a noise.

In addition, the wiring WL1 and the first conductive film FCL can be formed without a complicated process. In First Embodiment, the semiconductor device less affected by a noise can be manufactured without complicating a process and increasing a chip area.

The advantage of the semiconductor device of First Embodiment when the semiconductor substrate SUB has the column region CR will hereinafter be described. As described above, when the semiconductor substrate SUB has the column region CR, ON resistance can be reduced while maintaining the withstand voltage because the withstand voltage can be maintained even when the n type impurity concentration in the drift region DR is increased.

In the semiconductor substrate SUB having the column region CR, a depletion layer drastically spreads in the drift region at the time when the gate electrode GE is turned from ON to OFF. A noise is therefore likely to occur in the semiconductor substrate SUB having the column region CR.

The semiconductor device of First Embodiment, however, can simultaneously satisfy low noise, low ON resistance, and high withstand voltage because it can be less affected by a noise even when the semiconductor substrate SUB has the column region CR.

Second Embodiment

Figure 15A:
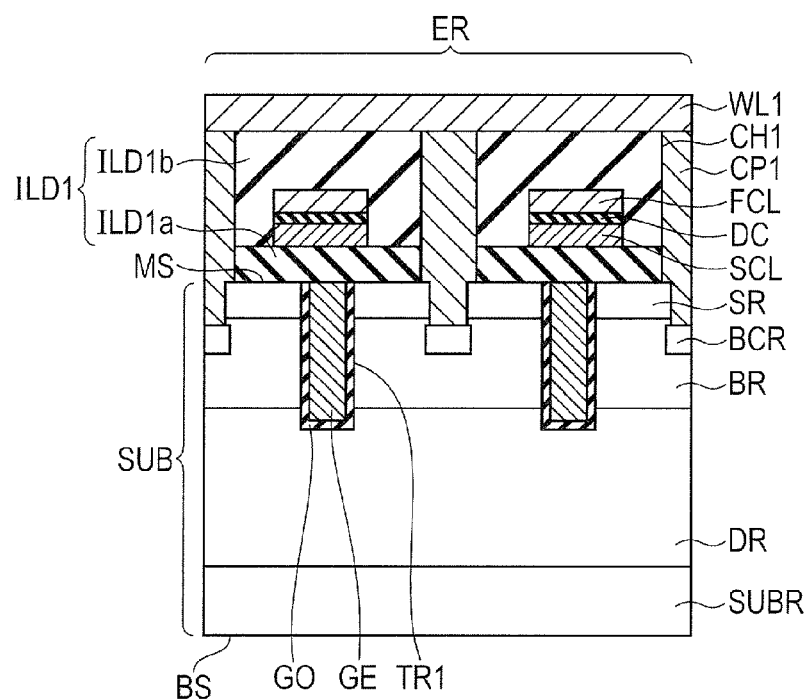
FIGS. 15A and 15B are each a cross-sectional view of a semiconductor device of Second Embodiment.
Figure 15B:
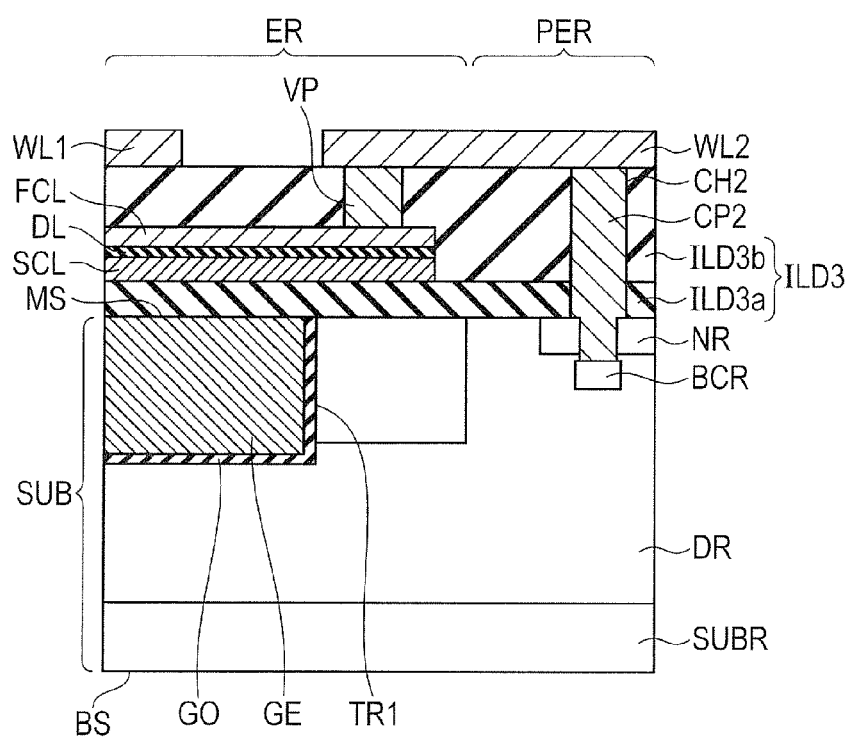

The constitution of a semiconductor device of Second Embodiment will hereinafter be described. Here, a difference from First Embodiment will be described mainly. FIG. 15A is a cross-sectional view, in an element region ER, of the semiconductor device of Second Embodiment. FIG. 15B is a cross-sectional view, in a peripheral region PER, of the semiconductor device of Second Embodiment.

As FIGS. 15A and 15B show, the semiconductor device of Second Embodiment has a semiconductor substrate SUB. The semiconductor device of Second Embodiment has the element region ER and the peripheral region PER. The semiconductor substrate SUB has, in the element region ER, a substrate region SUBR, a drift region DR, a base region BR, and a source region SR. The semiconductor substrate SUB may have, in the element region ER, a base contact region BCR.

The semiconductor substrate SUB has, in the peripheral region PER, a substrate region SUBR, a drift region DR, and an n type impurity region NR. The semiconductor substrate SUB may have, in the peripheral region PER, a base contact region BCR.

The semiconductor device of Second Embodiment has, in the element region ER, a gate electrode GE, a wiring WL1, a wiring WL3, an interlayer insulating film ILD1, a contact plug CP1, a via plug VP, and a first conductive film FCL. The semiconductor device of Second Embodiment has, in the peripheral region PER, an interlayer insulating film ILD3, a contact plug CP2, and a wiring WL2. The semiconductor device of Second Embodiment is similar to the semiconductor device of First Embodiment in the above-described points.

As FIG. 15A shows, the semiconductor device of Second Embodiment has, in the element region ER, a second conductive film SCL. In this point, the semiconductor device of Second Embodiment is different from the semiconductor device of First Embodiment.

The second conductive film SCL is opposite to the first conductive film FCL while being insulated therefrom. For example, the second conductive film SCL is on the lower interlayer insulating film ILD1a and the first conductive film FCL is on the second conductive film SCL. This means that the first conductive film FCL and the conductive film SCL overlap with each other in the interlayer insulating film ILD1. The first conductive film FCL and the second conductive film SCL have therebetween a dielectric film DL. Via this film, the second conductive film SCL is opposite to the first conductive film FCL while being insulated therefrom. This means that a capacitance is formed between the first conductive film FCL and the second conductive film SCL.

The second conductive film SCL is made of, for example, doped polycrystalline Si. The dielectric film DL preferably has a dielectric constant higher than that of the interlayer insulating film ILD1. For example, when the interlayer insulating film ILD1 is made of HTO or BPSG, the dielectric film DL is made of silicon nitride (SiN).

Figure 16:
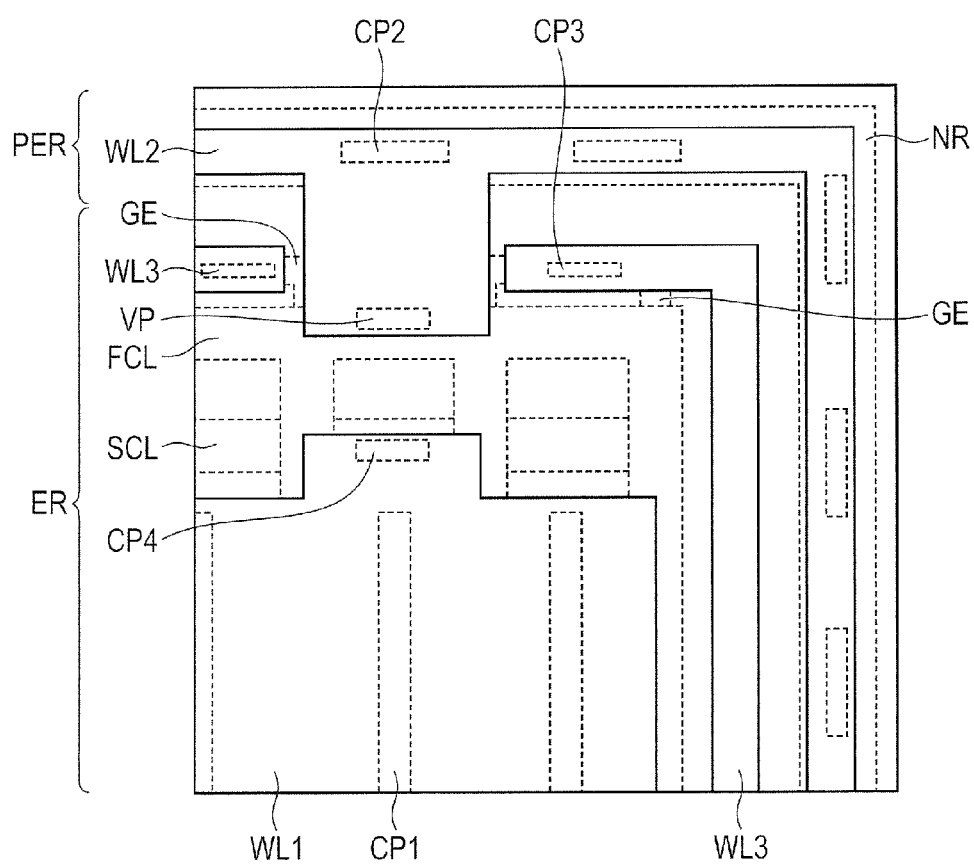
FIG. 16 is a top view, in the vicinity of a boundary between an element region and a peripheral region, of the semiconductor device of Second Embodiment.

The second conductive film SCL is electrically coupled to the source region SR. More specifically, as FIG. 16 shows, the second conductive film SCL is coupled to a contact plug CP4. The CP4 is coupled to the wiring WL1. The wiring WL1 is, as described above, electrically coupled to the source region SR so that the second conductive film SCL is electrically coupled to the source region SR. The capacitance formed between the first conductive film FCL and the second conductive film SCL is therefore a source-drain capacitance.

A method of manufacturing the semiconductor device of Second Embodiment will hereinafter be described.

The method of manufacturing the semiconductor device of Second Embodiment has a front end step S1 and a back end step S2. The front end step S1 in the method of manufacturing the semiconductor device of Second Embodiment is similar to that in the method of manufacturing the semiconductor device of First Embodiment.

The back end step S2 in the method of manufacturing the semiconductor device of Second Embodiment has a conductive film formation step S21 and a wiring step S22. The wiring step S22 is similar to that of the method of manufacturing the semiconductor device of First Embodiment.

The conductive film formation step S21 has a first insulating film formation step S211, a second insulating film formation step S213, and a conductive film & dielectric film patterning step S214. The first insulating film formation step S211 and the second insulating film formation step S213 are similar to those of the method of manufacturing the semiconductor device of First Embodiment. The method of manufacturing the semiconductor device of Second Embodiment is, however, different from the method of manufacturing the semiconductor device of First Embodiment in that the former one has the conductive film & dielectric film patterning step S214.

Figure 17:
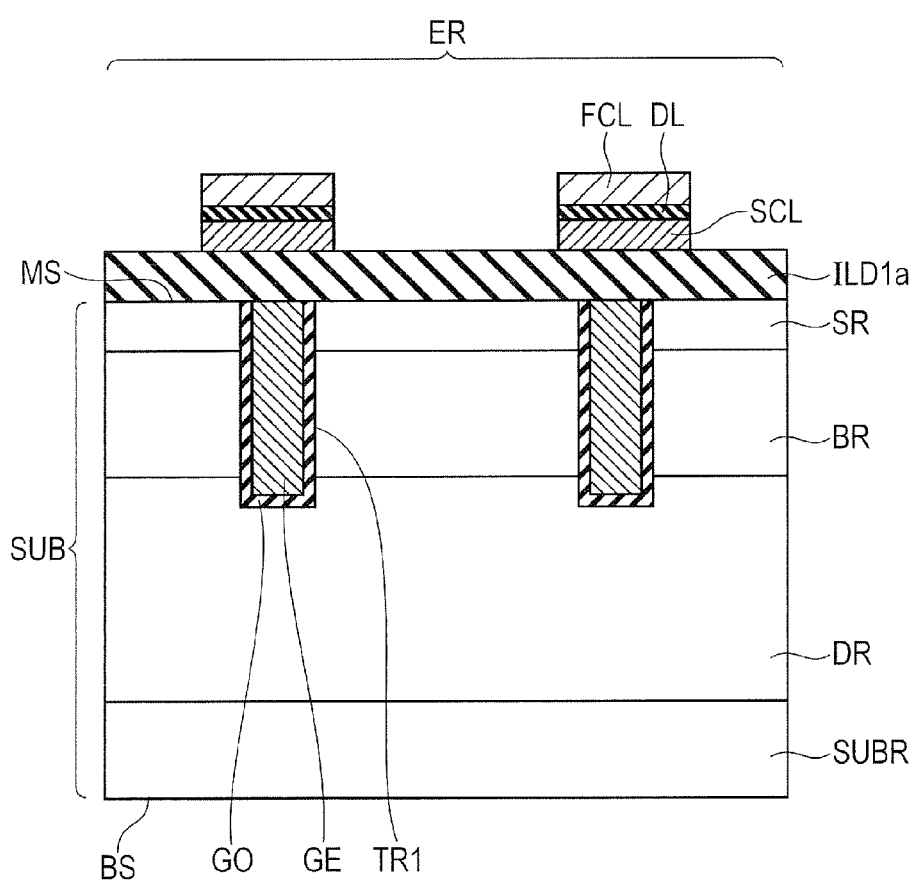
FIG. 17 is a cross-sectional view, in the element isolation region, of the semiconductor device of Second Embodiment during a conductive film & dielectric film formation step.

The conductive film & dielectric film patterning step S214 is performed before the first insulating film formation step S211 but before the second insulating film formation step S213. As FIG. 17 shows, in the conductive film & dielectric film patterning step S214, a second conductive film SCL is formed on the lower interlayer insulating film ILD1a, a dielectric film DL is formed on the second conductive film SCL, and a first conductive film FCL is formed on the dielectric film DL. The conductive film & dielectric film patterning step S214 is performed, for example, by successively forming a polycrystalline Si film, a SiN film, and a polycrystalline Si film by CVD and patterning the resulting polycrystalline Si films and SiN film by photolithography and etching.

No change occurs in the structure of the peripheral region PER after the conductive film & dielectric film patterning step S214 because none of the first conductive film FCL, the second conductive film SCL, and the dielectric film DL is formed in the peripheral region PER. The cross-section, in the peripheral region PER, of the semiconductor device of Second Embodiment during the conductive film & dielectric film patterning step S214 is therefore omitted.

The advantage of the semiconductor device of Second Embodiment will hereinafter be described.

In the semiconductor device of Second Embodiment, the first conductive film FCL is opposite to not only the wiring WL1 but also the second conductive film SCL while being insulated therefrom. The wiring WL1 and the second conductive film SCL are electrically coupled to the source region SR. In the semiconductor device of Second Embodiment, therefore, a source-drain additional capacitance C1 is formed not only between the first conductive film FCL and the wiring WL1 but also between the first conductive film FCL and the second conductive film SCL.

The influence of a noise can be reduced in the semiconductor device of Second Embodiment because the additional capacitance C1 can be increased further.

In the semiconductor device of Second Embodiment, when the dielectric film DL has a dielectric constant greater than that of the interlayer insulating film ILD1, the additional capacitance C1 can be increased further. In the semiconductor device of Second Embodiment, therefore, the influence of a noise can be reduced further when the dielectric film DL has a dielectric constant greater than that of the interlayer insulating film ILD1.

Third Embodiment

Figure 18A:
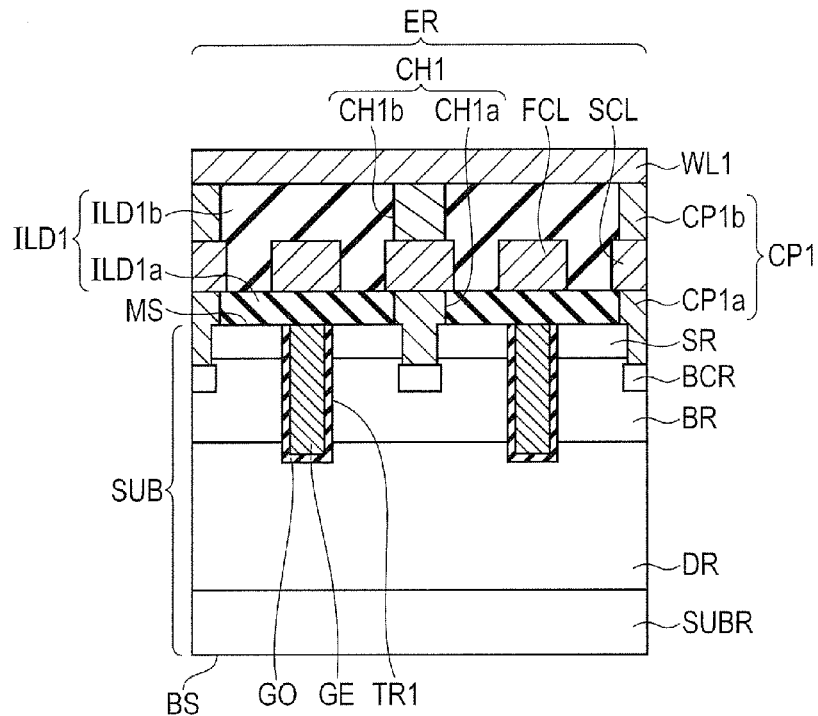
FIGS. 18A and 18B are each a cross-sectional view of a semiconductor device of Third Embodiment.
Figure 18B:
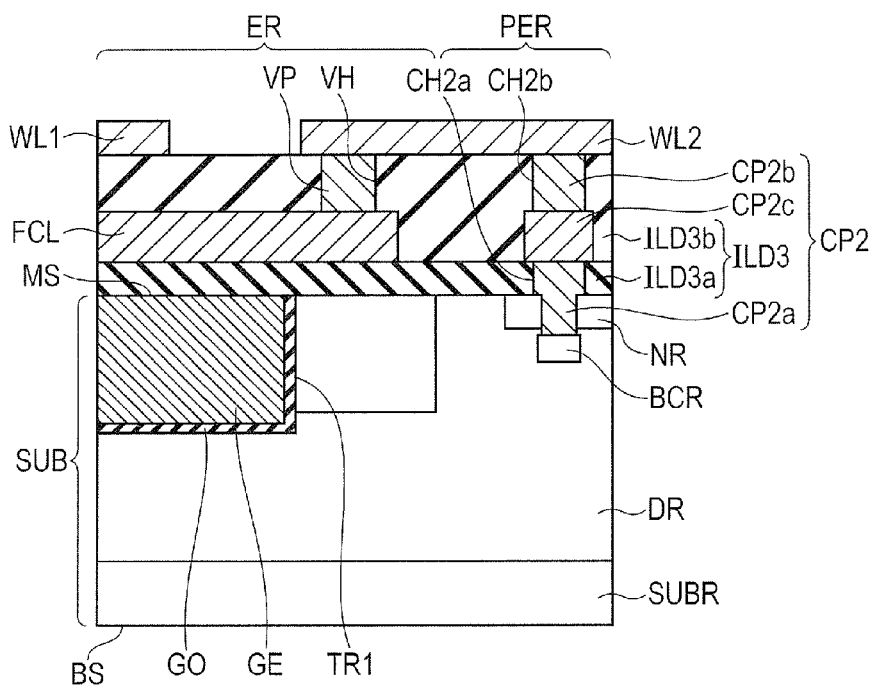

The constitution of a semiconductor device of Third Embodiment will hereinafter be described. Here, a difference from Second Embodiment will be described mainly. FIG. 18A is a cross-sectional view, in an element region ER, of the semiconductor device of Third Embodiment. FIG. 18B is a cross-sectional view, in a peripheral region PER, of the semiconductor device of Third Embodiment.

As FIGS. 18A and 18B show, the semiconductor device of Third Embodiment has a semiconductor substrate SUB. The semiconductor device of Third Embodiment has the element region ER and the peripheral region PER. The semiconductor substrate SUB has, in the element region ER, a substrate region SUBR, a drift region DR, a base region BR, and a source region SR. The semiconductor substrate SUB may have, in the element region ER, a base contact region BCR.

The semiconductor substrate SUB has, in the peripheral region PER, a substrate region SUBR, a drift region DR, and an n type impurity region NR. The semiconductor substrate SUB may have, in the peripheral region PER, a base contact region BCR.

The semiconductor device of Third Embodiment has, in the element region ER, a gate electrode GE, a wiring WL1, a wiring WL3, an interlayer insulating film ILD1, a contact plug CP1, a via plug VP, a first conductive film FCL, and a second conductive film SCL.

The semiconductor device of Third Embodiment has, in the peripheral region PER, an interlayer insulating film ILD3, a contact plug CP2, and a wiring WL2. This means that the semiconductor device of Third Embodiment is similar to the semiconductor device of Second Embodiment in the above-described points.

As FIG. 18A shows, in the semiconductor device of Third Embodiment, the first conductive film FCL and the second conductive film SCL are made of the same material. In the semiconductor device of Third Embodiment, the first conductive film FCL and the second conductive film SCL are formed in the same layer. In other words, in the semiconductor device of Third Embodiment, the first conductive film FCL and the second conductive film SCL are formed on the same plane. In this point, the semiconductor device of Third Embodiment is different from the semiconductor device of Second Embodiment.

The second conductive film SCL is on the lower interlayer insulating film ILD1a. The first conductive film FCL is on the lower interlayer insulating film ILD1a. The first conductive film FCL and the second conductive film SCL are therefore present in the same layer (meaning, on the same plane).

The second conductive film SCL is adjacent to the first conductive film FCL. In other words, the second conductive film SCL is sandwiched between two first conductive films FCL. The first conductive film FCL is therefore opposite to the second conductive film SCL, while being insulated therefrom.

The first conductive film FCL and the second conductive film SCL are made of the same material. The first conductive film FCL and the second conductive film SCL are each made of doped polycrystalline Si. The first conductive film FCL and the second conductive film SCL may be made of a metal material such as Al or Al alloy.

Figure 19:
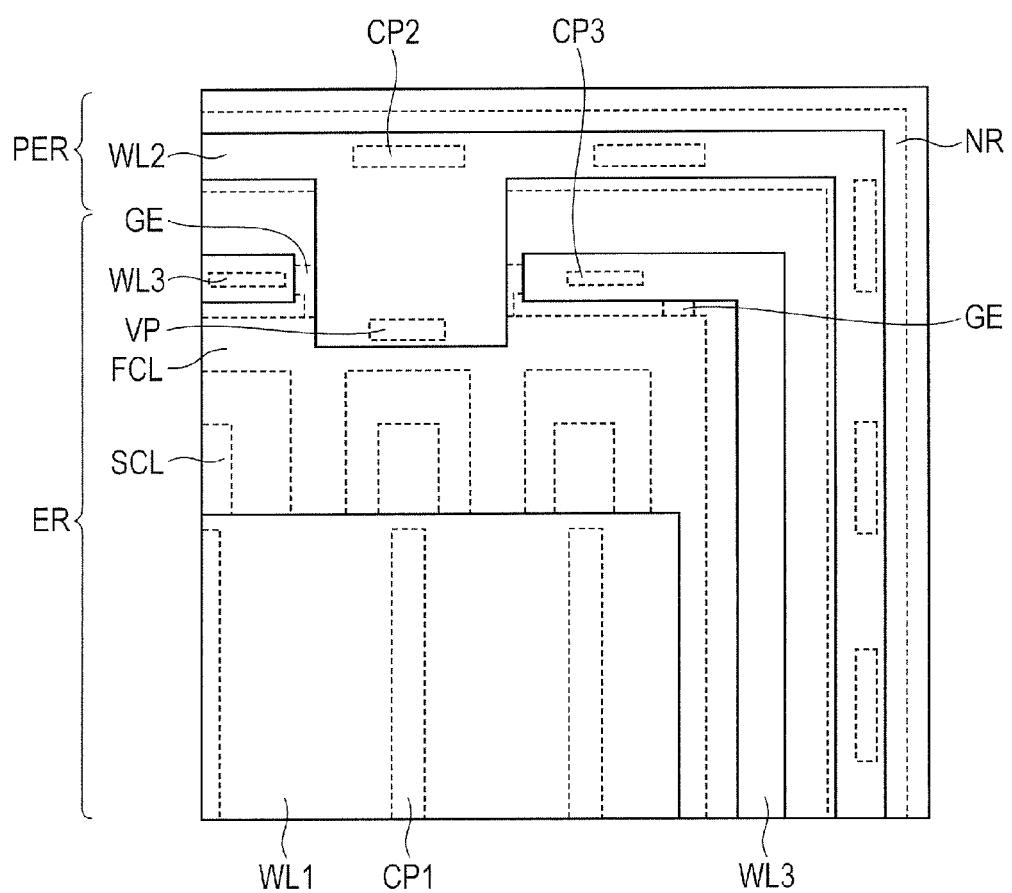
FIG. 19 is a top view, in the vicinity of a boundary between an element region and a peripheral region, of the semiconductor device of Third Embodiment.

The second conductive film SCL is electrically coupled to the source region SR. More specifically, as FIG. 19 shows, the second conductive film SCL is coupled to the contact plug CP1. The wiring WL1 is electrically coupled to the source region SR, as described above. Accordingly, the second conductive film SCL is electrically coupled to the source region SR. The capacitance formed between the first conductive film FCL and the second conductive film SCL is therefore a source-drain capacitance.

As FIG. 18A shows, the contact plug CP1 has a lower contact plug CP1a and an upper contact contact plug CP1b. The lower contact plug CP1a is in the lower interlayer insulating film ILD1a. The lower contact plug CP1a is coupled to the source region SR and the base contact region BCR. The upper contact plug CP1b is in the upper interlayer insulating film ILD1b. The upper contact plug CP1b is coupled to the wiring WL1.

A contact hole CH1 has a lower contact hole CH1a and an upper contact hole CH1b. The lower contact hole CH1a is in the lower interlayer insulating film ILD1a. The lower contact hole CH1a has therein the lower contact plug CP1a. The upper contact hole CH1b is in the upper interlayer insulating film ILD1b. The upper contact hole CH1b has therein the upper contact plug CP1b.

The lower contact plug CP1a and the upper contact plug CP1b may be made of the same material. The lower contact plug CP1a and the upper contact plug CP1b may be made of respectively different materials. When the first conductive film FCL and the second conductive film SCL are made of doped polycrystalline Si, the lower contact plug CP1a is made of, for example, doped polycrystalline Si and the upper contact plug CP1b is made of, for example, W. When the first conductive film FCL and the second conductive film SCL are made of Al, the lower contact plug CP1a and the upper contact plug CP1b are both made of, for example, W.

As FIG. 18A shows, the contact plug CP2 has a lower contact plug CP2a, an upper contact plug CP2b, and an intermediate contact plug CP2c. The lower contact plug CP2a is in the lower interlayer insulating film ILD3a. The lower contact plug CP2a is coupled to the n type impurity region NR and the base contact region BCR. The upper contact plug CP2b is in the upper interlayer insulating film ILD3b. The upper contact plug CP2b is coupled to the wiring WL2. The intermediate contact plug CP2c is on the lower interlayer insulating film ILD3a. The intermediate plug CP2c is present between the lower contact plug CP2a and the upper contact plug CP2b.

The contact hole CH2 has a lower contact hole CH2a and an upper contact hole CH2b. The lower contact hole CH2a is in the lower interlayer insulating film ILD3a. The lower contact hole CH2a has therein the lower contact plug CP2a. The upper contact hole CH2b is in the upper interlayer insulating film ILD3b. The upper contact hole CH2b has therein the upper contact plug CP2b.

A material used for the formation of the intermediate contact plug CP2c is same as that used for the formation of the first conductive film FCL and the second conductive film SCL.

The second conductive film SCL may be formed between the lower contact plug CP1a and the upper contact plug CP1b. The second conductive film SCL is thereby electrically coupled to the source region SR.

A method of manufacturing the semiconductor device of Third Embodiment will next be described.

The method of manufacturing the semiconductor device of Third Embodiment has a front end step S1 and a back end step S2. The front end step S1 in the method of manufacturing the semiconductor device of Third Embodiment is similar to that in the method of manufacturing the semiconductor device of First Embodiment and that in the method of manufacturing the semiconductor device of Second Embodiment.

The back end step S2 in the method of manufacturing the semiconductor device of Third Embodiment has a conductive film formation step S21 and a wiring step S22.

The conductive film formation step S21 has a first insulating film formation step S211, a second insulating film formation step S213, a lower contact plug formation step S216, and a conductive film simultaneous formation step S217.

The first insulating film formation step S211 and the second insulating film formation step S213 are similar to those of the method of manufacturing the semiconductor device of Second Embodiment. The method of manufacturing the semiconductor device of Third Embodiment is different from the method of manufacturing the semiconductor device of Second Embodiment in that the former one includes the lower contact plug formation step S216 and the conductive film simultaneous formation step S217.

Figure 20A:
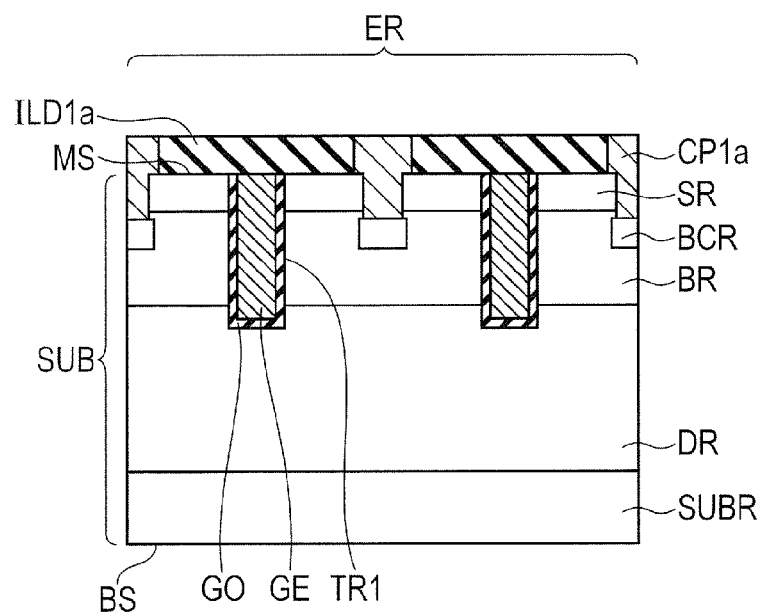
FIGS. 20A and 20B are each a cross-sectional view of the semiconductor device of Third Embodiment during a lower contact plug formation step.

The lower contact plug formation step S216 is performed after the first insulating film formation step S211 but before the conductive film simultaneous formation step S217. FIG. 20A is a cross-sectional view, in an element region ER, of the semiconductor device of Third Embodiment in the lower contact plug formation step S216. As FIG. 20A shows, in the lower contact plug formation step S216, a lower contact hole CH1a and a lower contact plug CP1a are formed. In the lower contact plug formation step S216, first, the lower contact hole CH1a is formed at a position, corresponding to the source region SR, in the lower interlayer insulating film ILD1a. Formation of the lower contact hole CH1a is achieved by anisotropic etching, for example, RIE.

Next, the lower contact plug CP1a is formed. The lower contact plug CP1a is formed in the lower contact hole CH1a. Formation of the lower contact plug CP1a is performed, for example, by forming a doped polycrystalline Si or W film by CVD and removing a portion of the resulting film that has protruded from the lower contact hole CH1a by CMP.

Figure 20B:
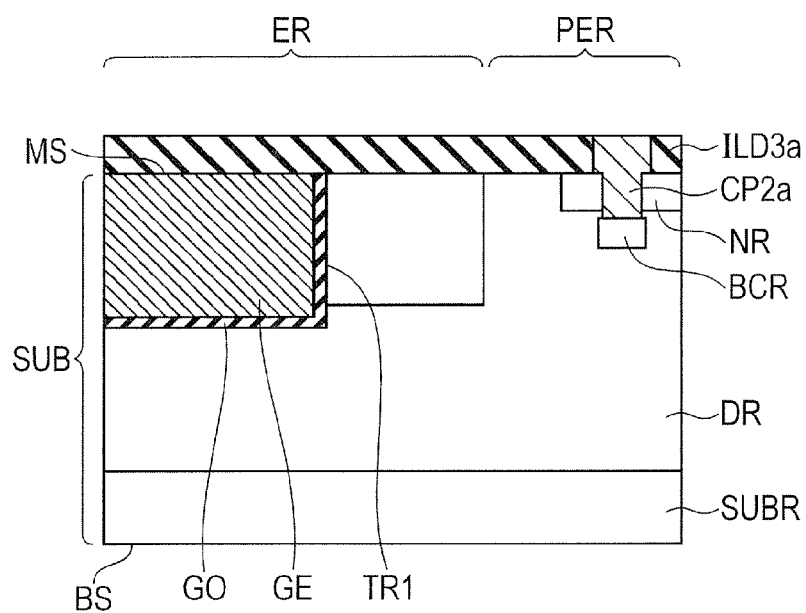

FIG. 20B is a cross-sectional view, in a peripheral region PER, of the semiconductor device of Third Embodiment in the lower contact plug formation step S216. As FIG. 20B shows, in the lower contact plug formation step S216, a lower contact hole CH2a and a lower contact plug CP2a are formed.

In the lower contact plug formation step S216, first, the lower contact hole CH2a is formed at a position, corresponding to the n type impurity region NR, in the lower interlayer insulating film ILD3a. Formation of the lower contact hole CH2a is achieved by anisotropic etching, for example, RIE.

Next, the lower contact plug CP2a is formed. The lower contact plug CP2a is formed in the lower contact hole CH2a. Formation of the lower contact plug CP2a is achieved, for example, by forming a doped polycrystalline Si or W film by CVD and removing a portion of the resulting film that has protruded from the lower contact hole CH2a by CMP.

The conductive film simultaneous formation step S217 is performed after the lower contact plug formation step S216 but before the second insulating film formation step S213.

Figure 21A:
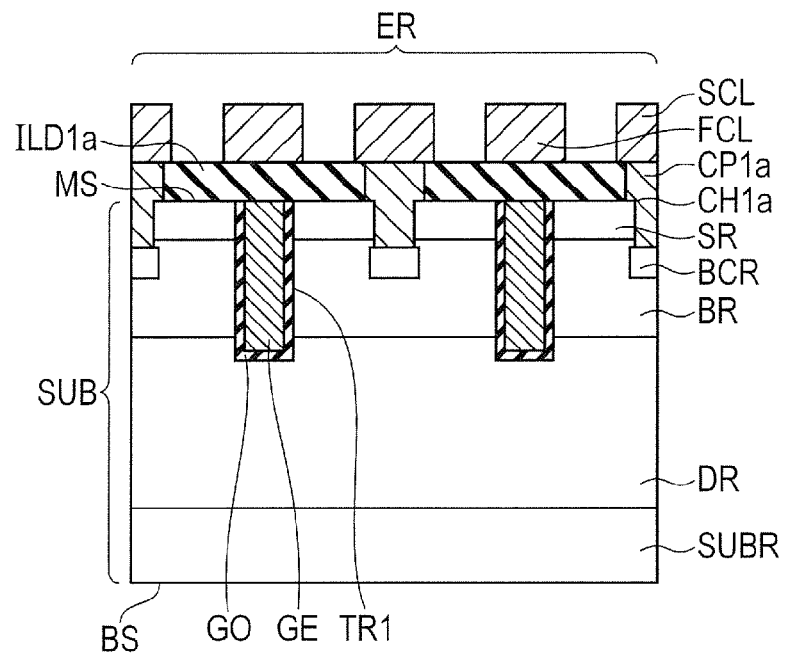
FIGS. 21A and 21B are each a cross-sectional view of the semiconductor device of Third Embodiment during a conductive film simultaneous formation step.
Figure 21B:
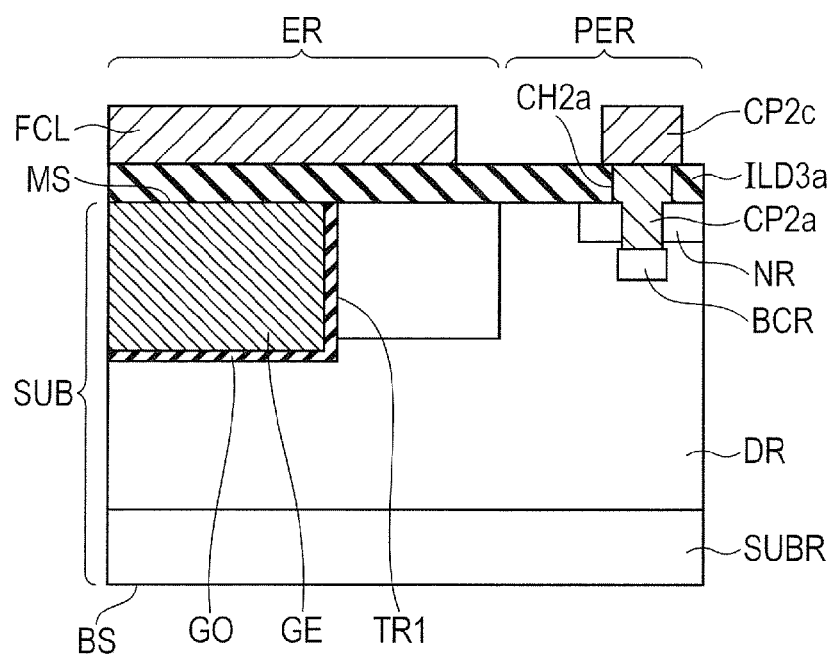

As FIG. 21A shows, in the conductive film simultaneous formation step S217, a first conductive film FCL and a second conductive film SCL are formed on the lower interlayer insulating film ILD1a. As FIG. 21B shows, in the conductive film simultaneous formation step S217, an intermediate contact plug CP2c is formed on the lower interlayer insulating film ILD3a. In the conductive film simultaneous formation step S217, first a doped polycrystalline silicon or Al film is formed on the lower interlayer insulating film ILD1a. This film formation is performed using, for example, sputtering.

Then, the doped polycrystalline silicon or Al film thus formed is patterned. This patterning is performed using, for example, photolithography and etching. This patterning is performed so as to locate the second conductive film SCL on the lower contact plug CP1a, locate the intermediate contact plug CP2c on the lower contact plug CP2a, and locate the first conductive film FCL between two adjacent second conductive films SCL. By this step, the first conductive film FCL, the second conductive film SCL, and the intermediate contact plug CP2c are formed simultaneously in the same layer.

The wiring step S22 has an upper contact plug formation step S224 and a wiring patterning step S223.

Figure 22A:
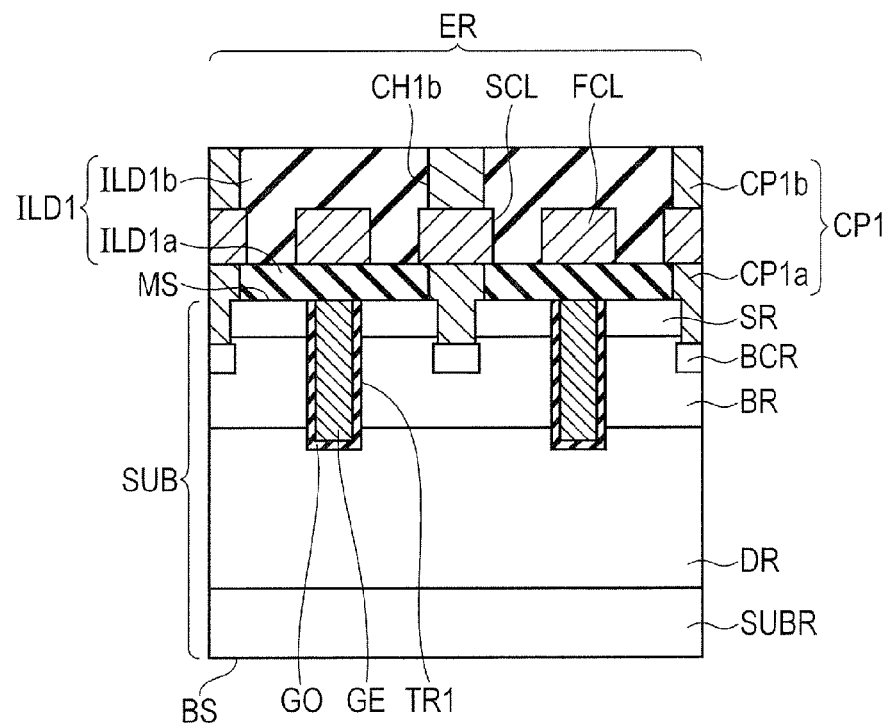
FIGS. 22A and 22B are each a cross-sectional view of the semiconductor device of Third Embodiment during an upper contact plug formation step.

The upper contact plug formation step S224 is performed after the second insulating film formation step S213 but before the wiring patterning step S223. FIG. 22A is a cross-sectional view, in the element region ER, of the semiconductor device of Third Embodiment during the upper contact plug formation step S224. As FIG. 22A shows, in the upper contact plug formation step S224, an upper contact hole CH1b and an upper contact plug CP1b are formed. In the upper contact plug formation step S224, a via hole VH and a via plug VP are formed.

In the upper contact plug formation step S224, first, the upper contact hole CH1b and the via hole VH are formed in the upper interlayer insulating film ILD1b. Formation of the upper contact hole CH1b and the via hole VH is performed by anisotropic etching, for example, RIE.

Next, the upper contact plug CP1b is formed. The upper contact plug CP1b is formed in the upper contact hole CH1b. Formation of the upper contact plug CP1b is achieved, for example, by forming a doped polycrystalline Si or W film by CVD and then removing a portion of the resulting film that has protruded from the upper contact hole CH1b by CMP.

Figure 22B:
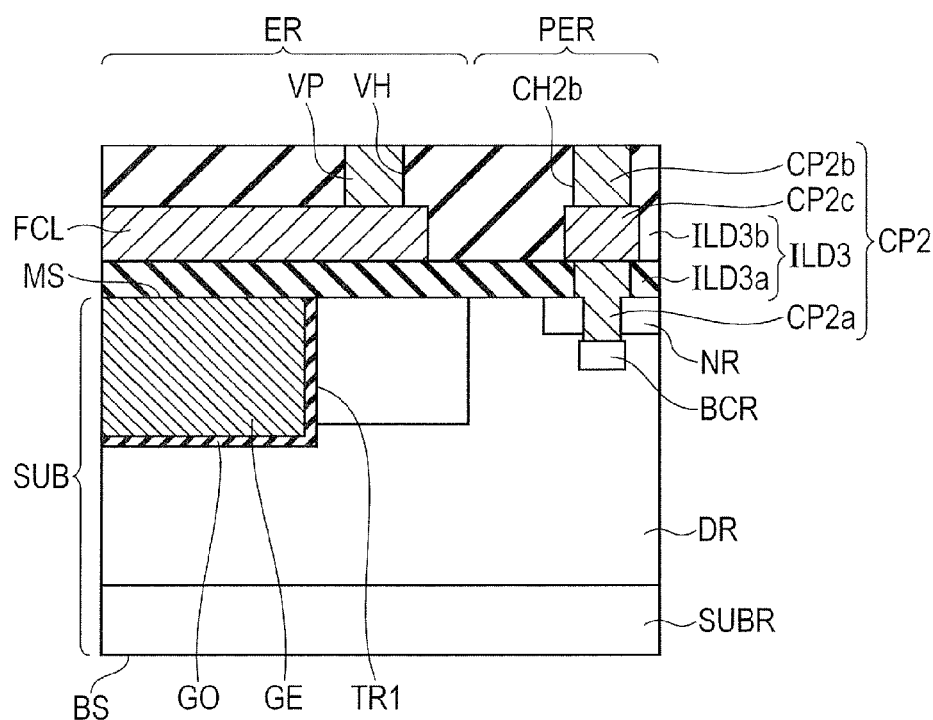

FIG. 22B is a cross-sectional view, in the peripheral region PER, of the semiconductor device of Third Embodiment during the upper contact plug formation step S224. As FIG. 22B shows, in the upper contact plug formation step S224, an upper contact hole CH2b and an upper upper contact plug CP2b are formed.

In the upper contact plug formation step S224, first, the upper contact hole CH2b is formed at a position, corresponding to the lower contact plug CP2a, in the upper interlayer insulating film ILD3b. Formation of the upper contact hole CH2b is performed by anisotropic etching, for example, RIE.

Next, the upper contact plug CP2b is formed. The upper contact plug CP2b is formed in the upper contact hole CH2b. Formation of the upper contact plug CP2b is performed, for example, by forming a doped polycrystalline Si or W film by CVD and removing a portion of the resulting film that has protruded from the upper contact hole CH2b by CMP.

The advantage of the semiconductor device of Third Embodiment will hereinafter be described.

In the semiconductor device of Third Embodiment, the first conductive film FCL is opposite to not only the wiring WL1 but also the second conductive film SCL while being insulated therefrom. The wiring WL1 and the second conductive film SCL are electrically coupled to the source region SR. In the semiconductor device of Third Embodiment, therefore, a source-drain additional capacitance C1 is formed not only between the first conductive film FCL and the wiring WL1 but also between the first conductive film FCL and the second conductive film SCL.

The semiconductor device of Third Embodiment can be less affected by a noise because of a further increase in the additional capacitance C1.

In the semiconductor device of Third Embodiment, the first conductive film FCL and the second conductive film SCL are made of the same material and formed in the same layer. The first conductive film FCL and the second conductive film SCL can be formed by the same step. As a result, the interval between the first conductive film FCL and the second conductive film SCL can be formed with good precision. In other words, the semiconductor device of Third Embodiment can be manufactured while controlling the capacitance value of the additional capacitance C1 between the first conductive film FCL and the second conductive film SCL with good precision.

When in the semiconductor device of Third Embodiment, the first conductive film FCL and the second conductive film SCL are made of an Al or Al alloy metal material, the first conductive film FCL and the second conductive film SCL can have a reduced resistance. As a result, the semiconductor device of Third Embodiment can have a reduced parasitic resistance.

Fourth Embodiment

Figure 23A:
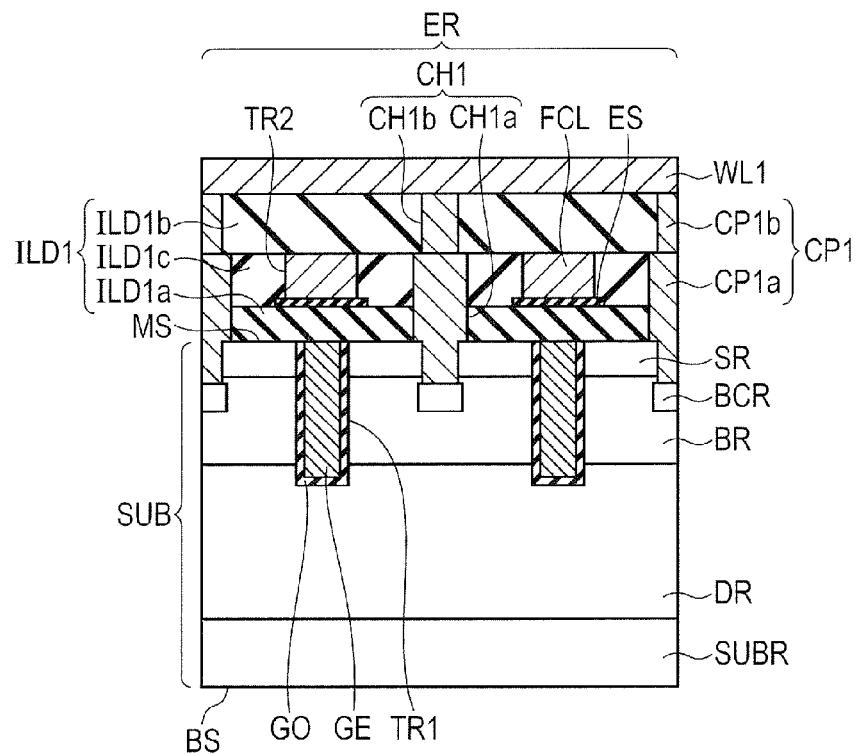
FIGS. 23A and 23B are each a cross-sectional view of a semiconductor device of Fourth Embodiment.
Figure 23B:
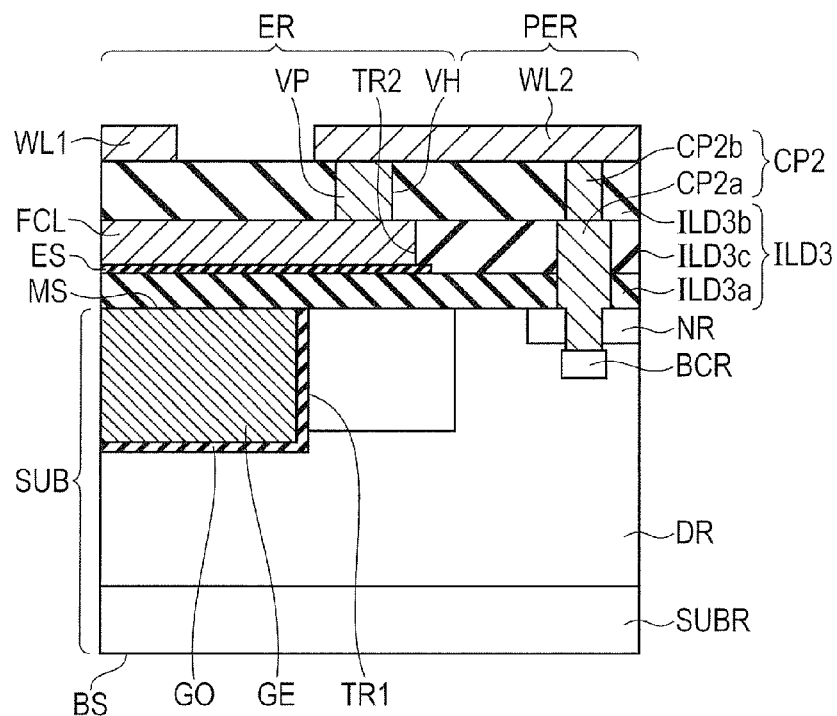

The constitution of a semiconductor device of Fourth Embodiment will hereinafter be described. Here, a difference from First Embodiment will be described mainly. FIG. 23A is a cross-sectional view, in an element region ER, of the semiconductor device of Fourth Embodiment. FIG. 23B is a cross-sectional view, in a peripheral region PER, of the semiconductor device of Fourth Embodiment.

The semiconductor device of Fourth Embodiment has a semiconductor substrate SUB. The semiconductor device of Fourth Embodiment has the element region ER and the peripheral region PER. The semiconductor substrate SUB has, in the element region ER, a substrate region SUBR, a drift region DR, a base region BR, and a source region SR. The semiconductor substrate SUB may have, in the element region ER, a bases contact region BCR.

The semiconductor substrate SUB has, in the peripheral region PER, a substrate region SUBR, a drift region DR, and an n type impurity region NR. The semiconductor substrate SUB may have, in the peripheral region PER, a base contact region BCR.

The semiconductor device of Fourth Embodiment has, in the element region ER, a gate electrode GE, a wiring WL1, a wiring WL3, an interlayer insulating film ILD1, a contact plug CP1, a via plug VP, and a first conductive film FCL. The semiconductor device of Fourth Embodiment has, in the peripheral region PER, an interlayer insulating film ILD3, a contact plug CP2, and a wiring WL2. This means that the semiconductor device of Fourth Embodiment is similar to the semiconductor device of First Embodiment in the above-described points.

As FIG. 23A shows, in the semiconductor device of Fourth Embodiment, the first conductive film FCL is made of the same material as the contact plug CP1. In this point, the semiconductor device of Fourth Embodiment is different from the semiconductor device of First Embodiment.

The interlayer insulating film ILD1 of the semiconductor device of Fourth Embodiment has a lower interlayer insulating film ILD1a, an upper interlayer insulating film ILD1b, and an intermediate interlayer insulating film ILD1c. The lower interlayer insulating film LD1a is made of, for example, HTO. As the upper interlayer insulating film ILD1b, for example, a p-SiO (silicon oxide formed by plasma CVD) film is used.

The lower interlayer insulating film ILD1a is on the main surface MS of the semiconductor substrate SUB. The intermediate interlayer insulating film ILD1c is on the lower interlayer insulating film ILD1a. The upper interlayer insulating film ILD1b is on the intermediate interlayer insulating film ILD1c.

The interlayer insulating film ILD3 of the semiconductor device of Fourth Embodiment has a lower interlayer insulating film ILD3a, an upper interlayer insulating film ILD3b, and an intermediate interlayer insulating film ILD3c. The lower interlayer insulating film ILD3a is made of, for example, HTO. As the upper interlayer insulating film ILD3b, for example, a p-SiO film is used.

The lower interlayer insulating film ILD3a is on the main surface MS of the semiconductor substrate SUB. The intermediate interlayer insulating film ILD3c is on the lower interlayer insulating film ILD3a. The upper interlayer insulating film ILD3b is on the intermediate interlayer insulating film ILD3c.

The semiconductor device of Fourth Embodiment has an etch stop film ES. The etch stop film ES is on the lower interlayer insulating film ILD1a. The etch stop film ES is made of a material having an etching rate different from that of the upper interlayer insulating film ILD1b. When the upper interlayer insulating film ILD1b is made of HTO or BPSG, the etch stop film ES is made of, for example, SiN.

The contact plug CP1 has a lower contact plug CP1a and an upper contact plug CP1b. The lower contact plug CP1a is in a lower contact hole CH1a formed in the lower interlayer insulating film ILD1a and the intermediate interlayer insulating film ILD1c. The upper contact plug CP1b is in an upper contact hole CH1b formed in the upper interlayer insulating film ILD1b.

The contact plug CP2 has a lower contact plug CP2a and an upper contact plug CP2b. The lower contact plug CP2a is in a lower contact hole CH2a formed in the lower interlayer insulating film ILD3a and the intermediate interlayer insulating film ILD3c. The upper contact plug CP2b is in an upper contact hole CH2b formed in the upper interlayer insulating film ILD3b.

The first conductive film FCL is in the intermediate interlayer insulating film ILD1c. The first conductive film FCL is made of the same material as the lower contact plug CP1a. For example, when the lower contact plug CP1a is made of W, the first conductive film FCL is made of W.

Figure 24:
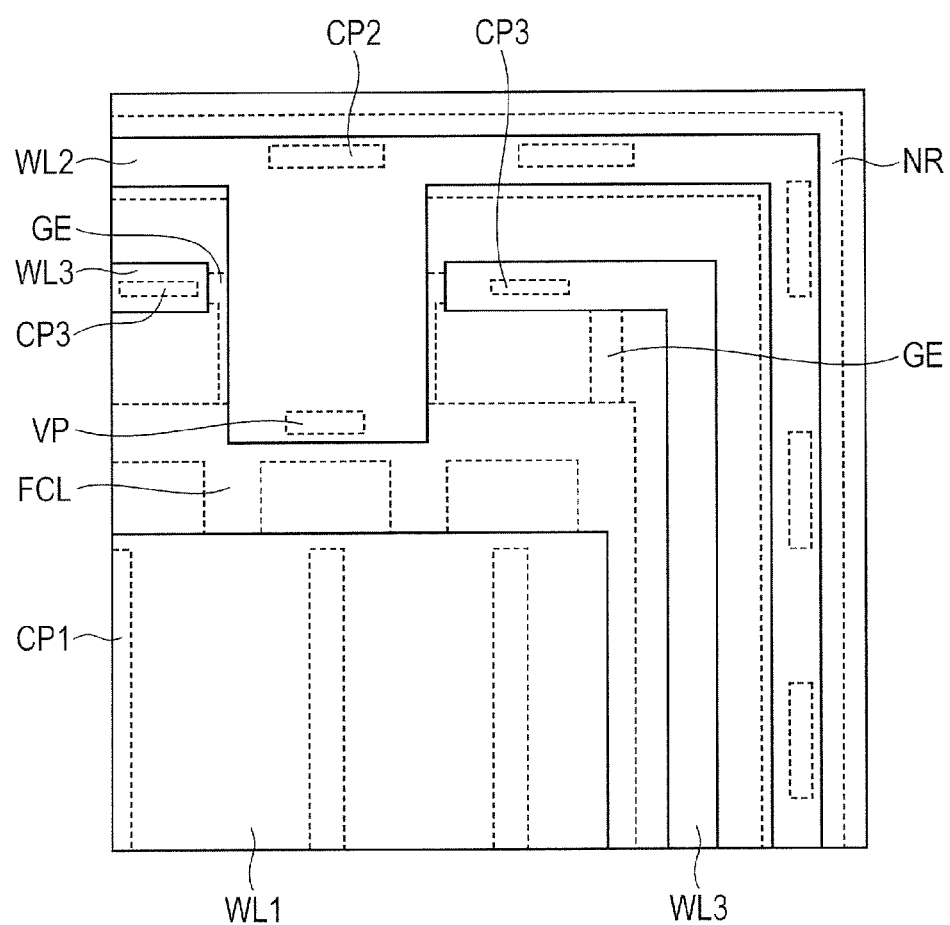
FIG. 24 is a top view, in the vicinity of a boundary between an element region and a peripheral region, of the semiconductor device of Fourth Embodiment.

As FIG. 24 shows, the first conductive film FCL is coupled to the wiring WL2 via the via plug VP.

A method of manufacturing the semiconductor device of Fourth Embodiment will hereinafter be described.

The method of manufacturing the semiconductor device of Fourth Embodiment has a front end step S1 and a back end step S2. The front end step S1 in the method of manufacturing the semiconductor device of Fourth Embodiment is similar to that in the method of manufacturing the semiconductor device of First Embodiment.

The back end step S2 has a conductive film formation step S21 and a wiring step S22. The conductive film formation step S21 has a first insulating film formation step S211, a second insulating film formation step S213, an etch stop film formation step S218, a conductive film & contact plug simultaneous formation step S219, and a third insulating film formation step S220. The first insulating film formation step S211 is similar to that of the method of manufacturing the semiconductor device of First Embodiment.

The etch stop film formation step S218 is performed after the first insulating film formation step S211 but before the second insulating film formation step S213. The conductive film & contact plug simultaneous formation step S219 is performed after the second insulating film formation step S213 but before the third insulating film formation step S220. The third insulating film formation step S220 is performed after the conductive film & contact plug simultaneous formation step S219 but before the wiring step S22.

Figure 25:
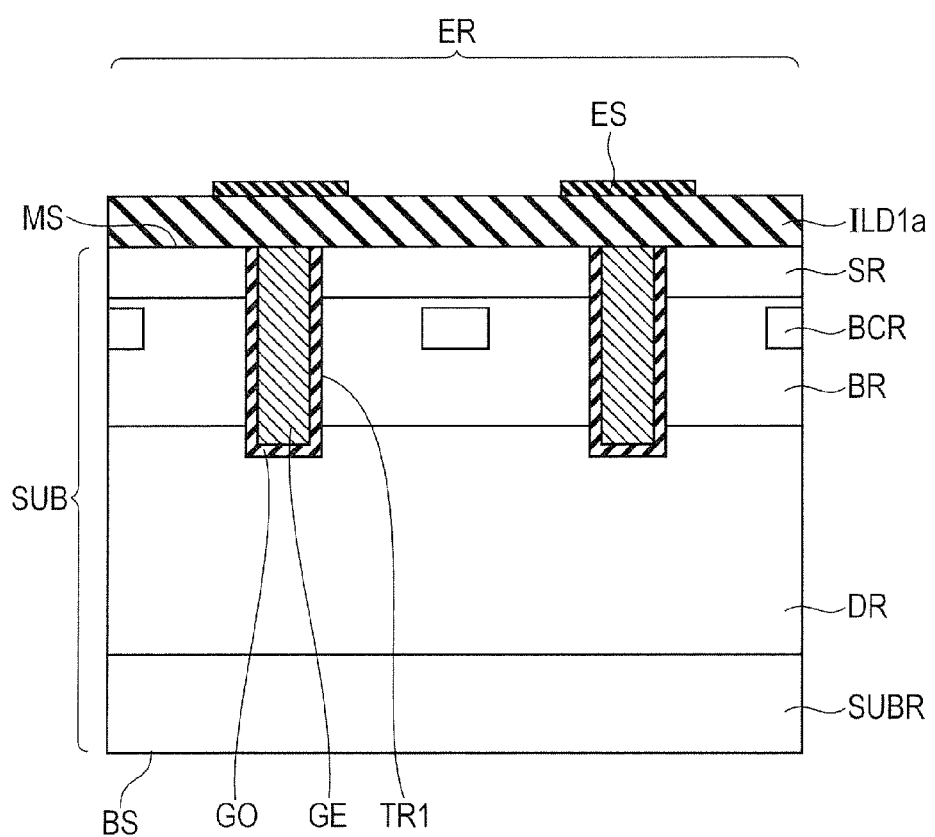
FIG. 25 is a cross-sectional view of the semiconductor device of Fourth Embodiment during an etch stop film formation step.

As FIG. 25 shows, in the etch stop film formation step S218, an etch stop film ES is formed. The etch stop film ES is formed at the position, on the lower interlayer insulating film ILD1a, where the first conductive film FCL is to be formed. The etch stop film formation step S218 is performed, for example, by forming a SiN or the like film on the lower interlayer insulating film ILD1a and patterning the resulting SiN or the like film by photolithography and etching.

The etch stop film ES is not formed in the peripheral region PER so that no change occurs in the structure of the peripheral region PER during the etch stop film formation step S218. The cross-section, in the peripheral region PER, of the semiconductor device of Fourth Embodiment during the etch stop film formation step S218 is therefore omitted.

Figure 26A:
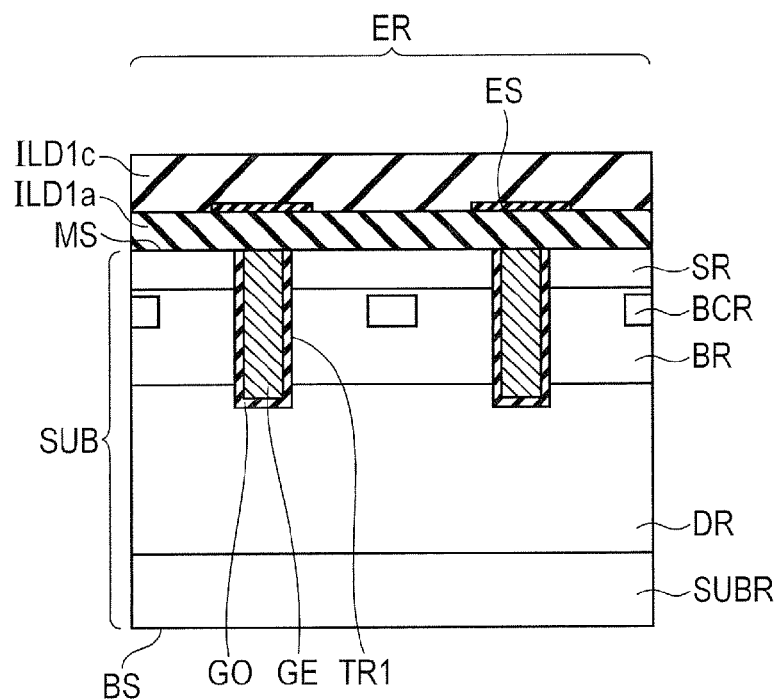
FIGS. 26A and 26B are each a cross-sectional view of the semiconductor device of Fourth Embodiment during a second insulating film formation step.
Figure 26B:
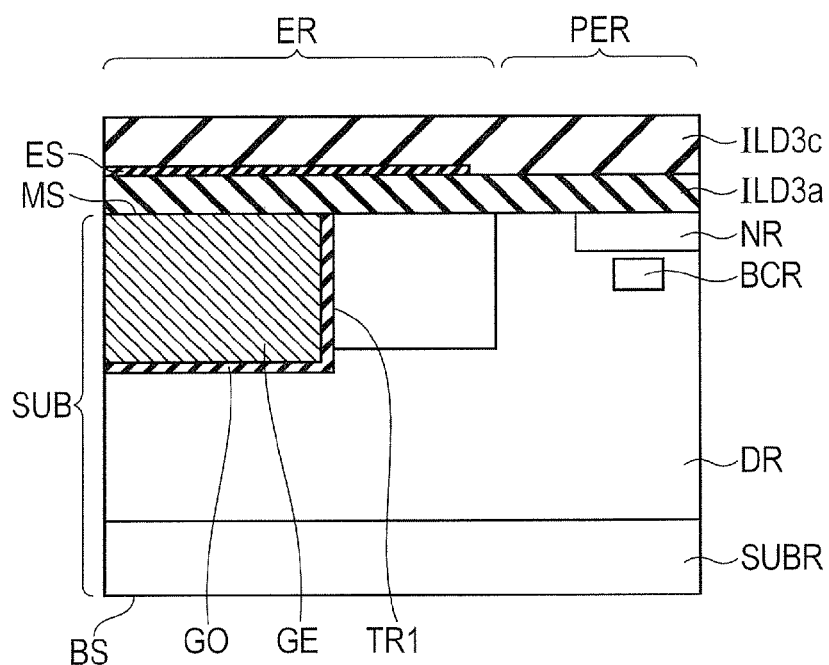

FIG. 26A is a cross-sectional view, in the element region ER, of the semiconductor device of Fourth Embodiment during the second insulating film formation step S213. FIG. 26B is a cross-sectional view, in the peripheral region PER, of the semiconductor device of Fourth Embodiment during the second insulating film formation step S213.

As FIG. 26A shows, in the second insulating film formation step S213, an intermediate interlayer insulating film ILD1c is formed on the lower interlayer insulating film ILD1a. Further, as FIG. 26B shows, an intermediate interlayer insulating film ILD3c is formed on the lower interlayer insulating film ILD3a in the second insulating film formation step S213.

The second insulating film formation step S213 is performed, for example, by forming an HTO or BPSG film by CVD and planarizing the surface of the resulting film by CMP (chemical mechanical polishing).

Figure 27A:
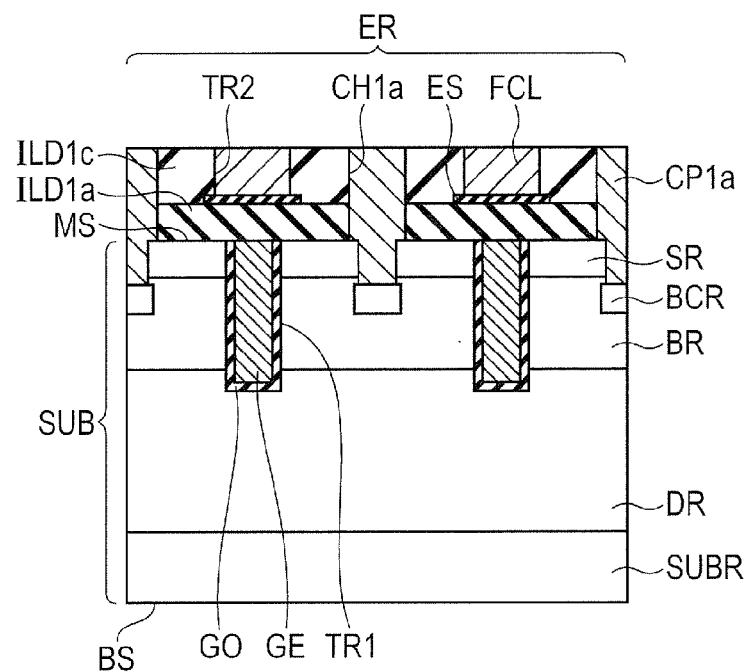
FIGS. 27A and 27B are each a cross-sectional view of the semiconductor device of Fourth Embodiment during a conductive film & contact plug simultaneous formation step.
Figure 27B:
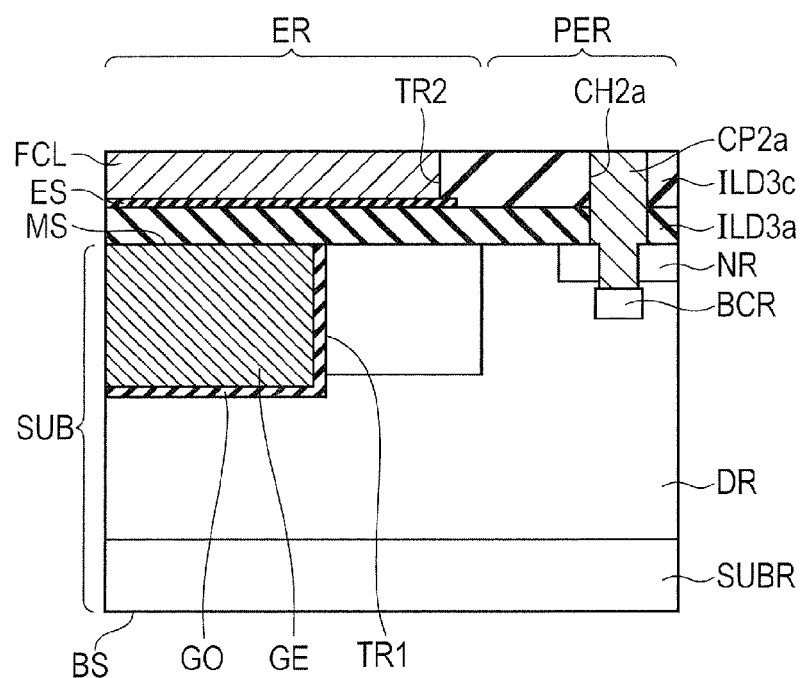

FIG. 27A is a cross-sectional view, in the element region ER, of the semiconductor device of Fourth Embodiment during the conductive film & contact plug simultaneous formation step S219. FIG. 27B is a cross-sectional view, in the peripheral region PER, of the semiconductor device of Fourth Embodiment during the conductive film & contact plug simultaneous formation step S219.

As FIG. 27A shows, in the conductive film & contact plug simultaneous formation step S219, a lower contact hole CH1a is formed in the lower interlayer insulating film ILD1a and the intermediate interlayer insulating film ILD1c. A trench TR2 is formed in the intermediate interlayer insulating film ILD1c. A lower contact plug CP1a is formed in the lower contact hole CH1a. A first conductive film FCL is formed in the trench TR2.

As FIG. 27B shows, in the conductive film & contact plug simultaneous formation step S219, a lower contact hole CH2a is formed in the lower interlayer insulating film ILD3a and the intermediate interlayer insulating film ILD3c. A lower contact plug CP2a is formed in the lower contact hole CH2a.

A lower contact hole CH1a, a lower contact hole CH2a, and a trench TR2 are formed using anisotropic etching such as RIE. As described above, the lower interlayer insulating film ILD1a has, at a position thereon where a first conductive film FCL is to be formed, the etch stop film ES. Anisotropic etching therefore stops on the etch stop film ES. As a result, the trench TR2 is not formed in the lower interlayer insulating film ILD1a.

Formation of a lower contact plug CP1a, a lower contact plug CP2a, and a first the conductive film FCL is performed, for example, by forming a W film by CVD and removing a portion of the W film that has protruded from the lower contact hole CH1a, the lower contact hole CH2a, and the trench TR2 by CMP. As a result, the lower contact plug CP1a, the lower contact plug CP2a, and the first conductive film FCL are formed simultaneously.

Figure 28A:
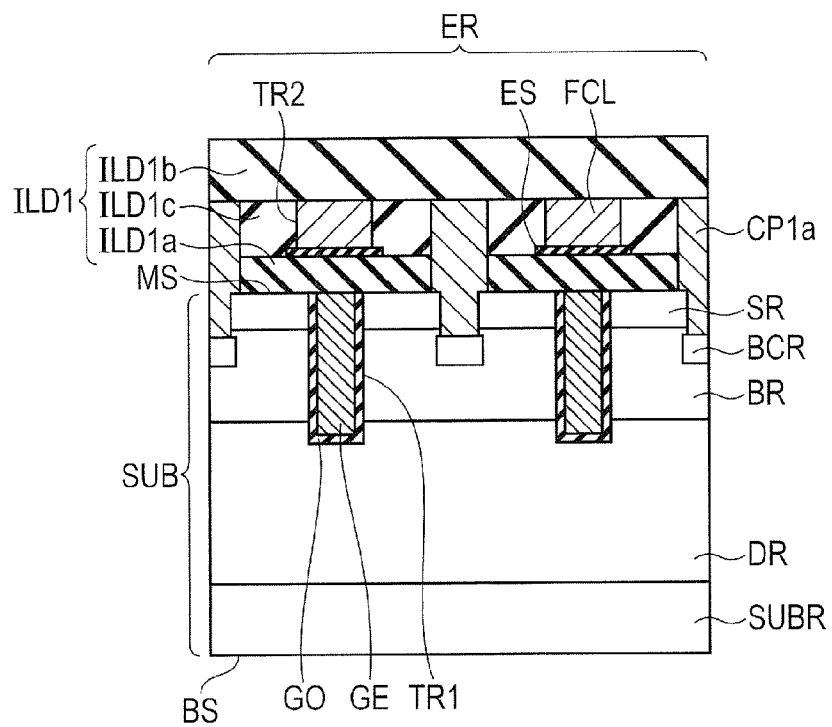
FIGS. 28A and 28B are each a cross-sectional view of the semiconductor device of Fourth Embodiment during a third insulating film formation step.
Figure 28B:
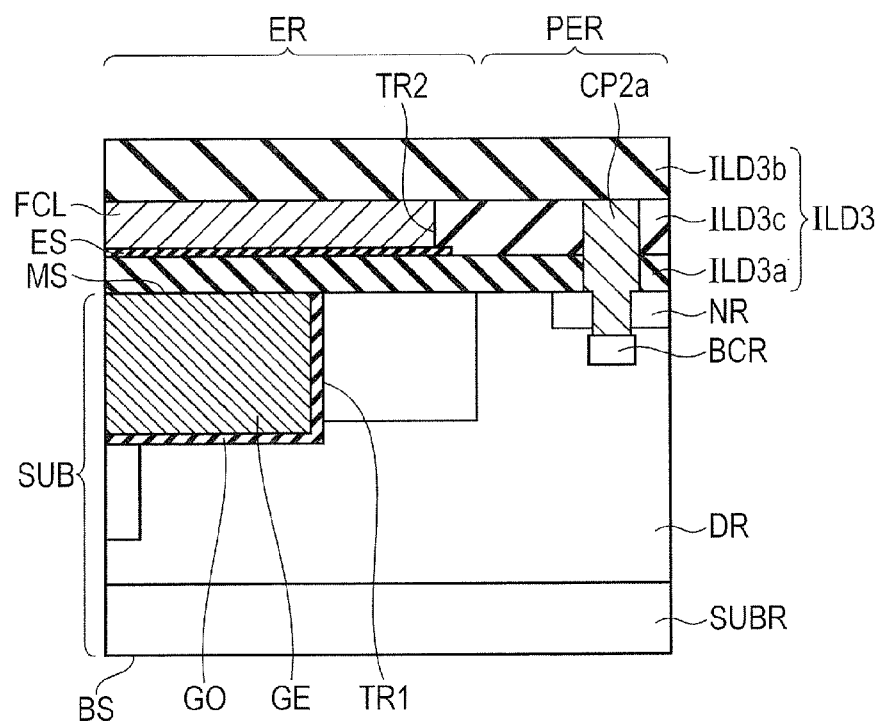

FIG. 28A is a cross-sectional view, in the element region ER, of the semiconductor device of Fourth Embodiment during the third insulating film formation step S220. FIG. 28B is a cross-sectional view, in the peripheral region PER, of the semiconductor device of Fourth Embodiment during the third insulating film formation step S220.

As FIG. 28A shows, in the third insulating film formation step S220, an upper interlayer insulating film ILD1b is formed on the intermediate interlayer insulating film ILD1c. Further, as FIG. 28B shows, in the third insulating film formation step S220, an upper interlayer insulating film ILD3b is formed on the intermediate interlayer insulating film ILD3c. The third insulating film formation step S220 is performed, for example, by plasma CVD.

The wiring step S22 has an upper contact plug formation step S224 and a wiring patterning step S223. This means that the wiring step S22 is similar to that in the method of manufacturing the semiconductor device of Third Embodiment.

The advantage of the semiconductor device of Fourth Embodiment will hereinafter be described.

Since a source-drain capacitance is formed between the first conductive film FCL and the wiring WL1, the semiconductor device of Fourth Embodiment can be less affected by a noise.

In addition, in the semiconductor device of Fourth Embodiment, the first conductive film FCL and the contact plug CP1 can be formed simultaneously. This makes it possible to suppress both misalignment during formation of the contact plug CP1 and short-circuit between the contact plug CP1 and the first conductive film FCL due to a residue at the time of forming the first conductive film FCL.

Fifth Embodiment

Figure 29A:
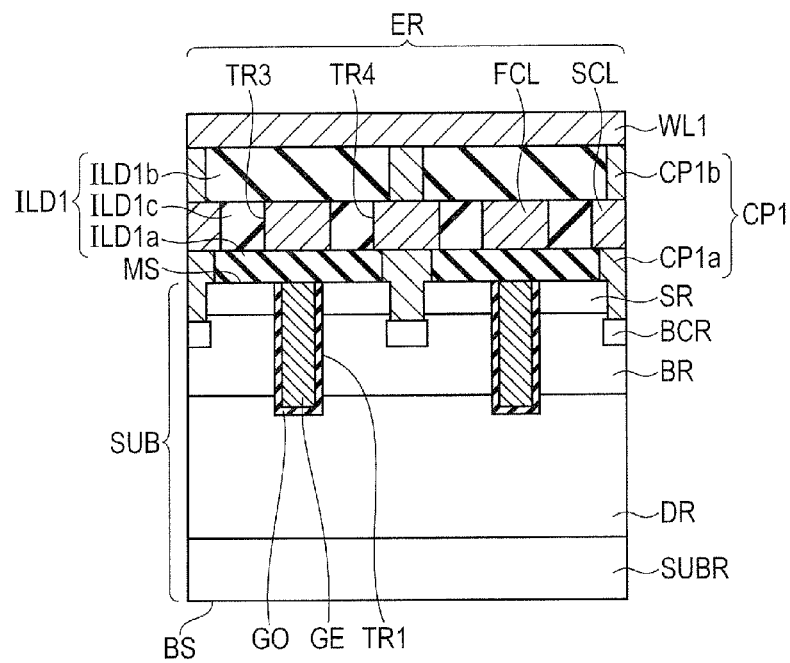
FIGS. 29A and 29B are each a cross-sectional view of the semiconductor device of Fourth Embodiment.
Figure 29B:
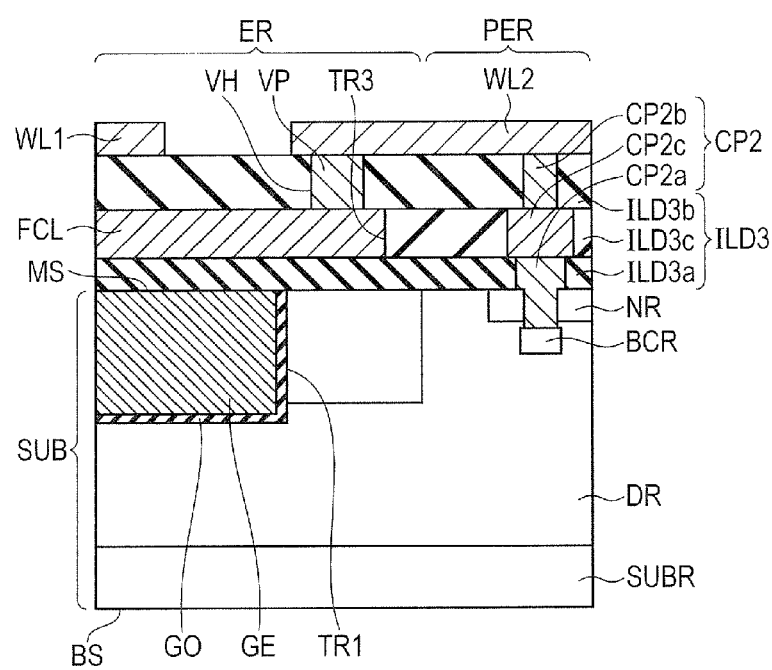

The constitution of a semiconductor device of Fifth Embodiment will hereinafter be described. Here, a difference from Fourth Embodiment will be described mainly. FIG. 29A is a cross-sectional view, in an element region ER, of the semiconductor device of Fifth Embodiment. FIG. 29B is a cross-sectional view, in a peripheral region PER, of the semiconductor device of Fifth Embodiment.

The semiconductor device of Fifth Embodiment has a semiconductor substrate SUB. The semiconductor device of Fifth Embodiment has the element region ER and the peripheral region PER. The semiconductor substrate SUB has, in the element region ER, a substrate region SUBR, a drift region DR, a base region BR, and a source region SR. The semiconductor substrate SUB may have, in the element region ER, a base contact region BCR.

The semiconductor substrate SUB has, in the peripheral region PER, a substrate region SUBR, a drift region DR, and an n type impurity region NR. The semiconductor substrate SUB may have, in the peripheral region PER, a base contact region BCR.

The semiconductor device of Fifth Embodiment has, in the element region ER, a gate electrode GE, a wiring WL1, a wiring WL3, an interlayer insulating film ILD1, a contact plug CP1, a via plug VP, and a first conductive film FCL. The semiconductor device of Fifth Embodiment has, in the peripheral region PER, an interlayer insulating film ILD3, a contact plug CP2, and a wiring WL2. This means that in the above-described points, the semiconductor device of Fifth Embodiment is similar to that of Fourth Embodiment.

As FIG. 29A shows, however, the semiconductor device of Fifth Embodiment is different from that of Fourth Embodiment in that the former one has a second conductive film SCL.

The second conductive film SCL is in an intermediate interlayer insulating film ILD1c. This means that the first conductive film FCL and the second conductive film SCL are in the same layer. The second conductive film SCL is present between two first conductive films FCL. Accordingly, the second conductive film SCL is opposite to the first conductive film FCL while being insulated therefrom.

The contact plug CP1 has a lower contact plug CP1a and an upper contact plug CP1b. The lower contact plug CP1a is in the lower interlayer insulating film ILD1a. The upper contact plug CP1b is in the upper interlayer insulating film ILD1b. The second conductive film SCL is present between the lower contact plug CP1a and the upper contact plug CP1b. The second conductive film SCL is therefore electrically coupled to the source region SR. The second conductive film SCL is made of the same material as the first conductive film FCL. The first conductive film FCL and the second conductive film SCL are made of the same material as the contact plug CP1.

A method of manufacturing the semiconductor device of Fifth Embodiment will hereinafter be described.

The method of manufacturing the semiconductor device of Fifth Embodiment has a front end step S1 and a back end step S2. The front end step S1 in the method of manufacturing the semiconductor device of Fifth Embodiment is similar to that in the method of manufacturing the semiconductor device of First Embodiment.

The back end step S2 has a conductive film formation step S21 and a wiring step S22. The conductive film formation step S21 has a first insulating film formation step S211, a lower contact plug formation step S216, a conductive film simultaneous formation step S217, a second insulating film formation step S213, and a third insulating film formation step S220. The first insulating film formation step S211 is similar to that in the method of manufacturing the semiconductor device of First Embodiment. The lower contact plug formation step S216 is similar to that in the method of manufacturing the semiconductor device of Third Embodiment. The third insulating film formation step S220 is similar to that in the method of manufacturing the semiconductor device of Fourth Embodiment.

The conductive film simultaneous formation step S217 in the method of manufacturing the semiconductor device of Fifth Embodiment is similar to that in the method of manufacturing the semiconductor device of Third Embodiment in that a first conductive film FCL and a second conductive film SCL are formed simultaneously in the same plane while using the same material, but it is different from the method of manufacturing the semiconductor device of Third Embodiment in the other point.

The conductive film simultaneous formation step S217 in the method of manufacturing the semiconductor device of Fifth Embodiment is performed after the second insulating film formation step S213 but before the third insulating film formation step S220.

Figure 30A:
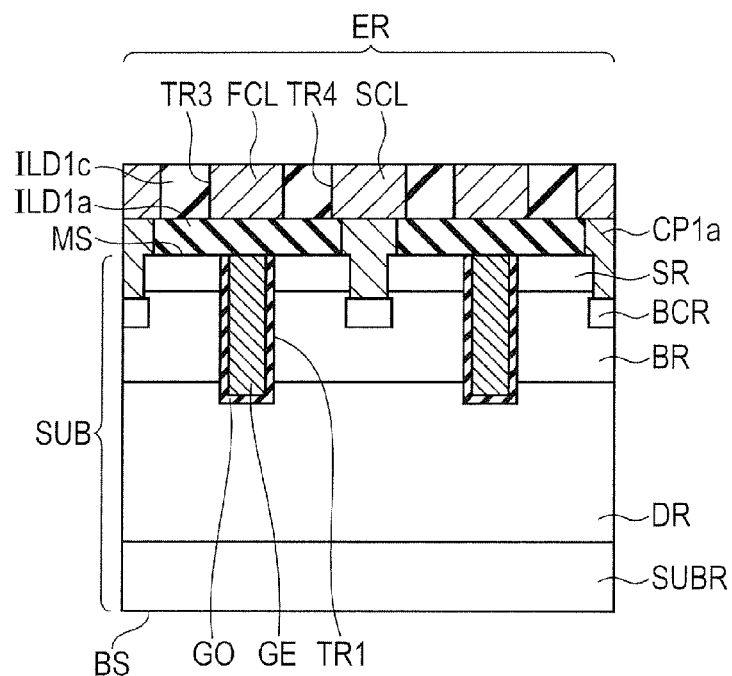
FIGS. 30A and 30B are each a cross-sectional view of the semiconductor device of Fourth Embodiment during a conductive film simultaneous formation step.
Figure 30B:
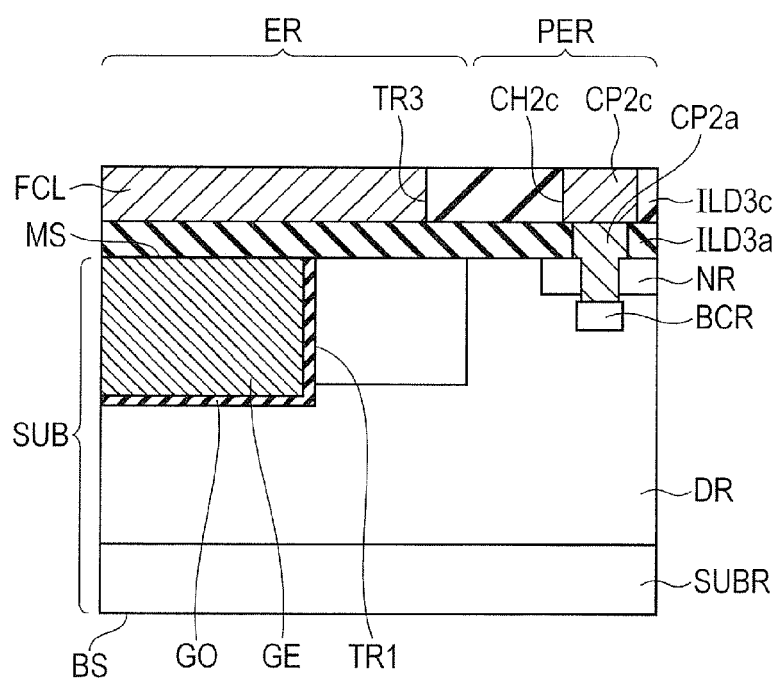

FIG. 30A is a cross-sectional view, in the element region ER, of the semiconductor device of Fifth Embodiment during the conductive film simultaneous formation step S217. FIG. 30B is a cross-sectional view, in the peripheral region PER, of the semiconductor device of Fifth Embodiment during the conductive film simultaneous formation step S217.

As FIG. 30A shows, in the conductive film simultaneous formation step S217, a trench TR3 and a trench TR4 are formed in the intermediate interlayer insulating film ILD1c. The trench TR4 is located on the lower contact plug CP1a. The trench TR3 is formed between two adjacent trenches TR4. In addition, a first conductive film FCL is formed in the trench TR3 and a second conductive film SCL is formed in the trench TR4.

As FIG. 30B shows, in the conductive film simultaneous formation step S217, an intermediate contact hole CH2c is formed in the interlayer insulating film ILD3c. An intermediate contact plug CP2c is formed in the intermediate contact hole CH2c.

Formation of the trench TR3, the trench TR4, and the intermediate contact hole CH2c is performed by anisotropic etching such as RIE. Formation of the first conductive film FCL, the second conductive film SCL, and the intermediate contact plug CP2c is performed, for example, by forming a W film by CVD and removing a portion of the resulting W film that has protruded from the trench TR3, the trench TR4, and the intermediate contact hole CH2c by CMP. As a result, the first conductive film FCL, the second conductive film SCL, and the intermediate contact plug CP2c are formed simultaneously.

The advantage of the semiconductor device of Fifth Embodiment will hereinafter be described.

In the semiconductor device of Fifth Embodiment, a source-drain capacitance is formed not only between the first conductive film FCL and the wiring WL1 but also between the first conductive film FCL and the second conductive film SCL. The semiconductor device of Fifth Embodiment can therefore be much less affected by a noise.

In the semiconductor device of Fifth Embodiment, the first conductive film FCL and the second conductive film SCL are made of the same material and present in the same layer with the same material. Since the first conductive film FCL and the second conductive film SCL can therefore be formed by one step, the distance between the first conductive film FCL and the second conductive film SCL thus formed is controlled with good precision. This means that the semiconductor device of Fifth Embodiment can be manufactured while controlling the capacitance value of the additional capacitance C1 between the first conductive film FCL and the second conductive film SCL with good precision. Further, the contact plug CP1 and the first conductive film FCL can be suppressed from short-circuiting due to a residue at the time of forming the first conductive film FCL.

The embodiments disclosed above are exemplary only and should not be considered to limit the invention. The scope of the invention is shown not by the above embodiments but by claims. Meanings equivalent to the claims and any change within the claims are intended to be included within the scope of the invention.

What is claimed is:

1. A semiconductor device, comprising:
   a semiconductor substrate having a first surface and a second surface, which is a surface on a side of the semiconductor substrate opposite to the first surface;
   a drain region in the semiconductor substrate proximal to the second surface and having a first conductivity type;
   a drift region in the semiconductor substrate between the first surface and the drain region, and having the first conductivity type;
   a base region in the semiconductor substrate between the first surface and the drift region, and having a second conductivity type;
   a source region in the semiconductor substrate at the first surface, and having the first conductivity type, the base region being sandwiched between the source region and the drift region;
   a gate electrode opposite to the base region sandwiched between the drift region and the source region, the gate electrode being insulated from the base region;
   a wiring provided over the first surface and electrically coupled to the source region; and
   a first conductive film provided over the first surface and electrically coupled to the drain region, wherein the first conductive film is, over the first surface, opposite to the wiring while being insulated therefrom.

2. The semiconductor device according to claim 1, further comprising a first interlayer insulating film provided between the wiring and the first surface,
wherein the first conductive film is provided in the first interlayer insulating film.

3. The semiconductor device according to claim 1, further comprising a second interlayer insulating film formed over the wiring,
wherein the first conductive film is present over the second interlayer insulating film.

4. A semiconductor device, comprising:
a semiconductor substrate having a first surface and a second surface, which is a surface on a side of the semiconductor substrate opposite to the first surface;
a drain region in the semiconductor substrate proximal to the second surface, and having a first conductivity type;
a drift region in the semiconductor substrate between the first surface and the drain region, and having the first conductivity type;
a base region in the semiconductor substrate between the first surface and the drift region, and having a second conductivity type;
a source region in the semiconductor substrate at the first surface, and having the first conductivity type, the base region being sandwiched between the source region and the drift region;
a gate electrode opposite to the base region sandwiched between the drift region and the source region, the gate electrode being insulated from the base region;
a wiring provided over the first surface and electrically coupled to the source region;
a first conductive film provided over the first surface and electrically coupled to the drain region;
a first interlayer insulating film provided between the wiring and the first surface; and
a second conductive film placed over the first surface and coupled to the source region,
wherein the first conductive film is, over the first surface, opposite to the wiring while being insulated therefrom,
wherein the first conductive film is provided in the first interlayer insulating film, and
wherein the second conductive film is opposite to the first conductive film while being insulated therefrom.

5. The semiconductor device according to claim 4, further comprising a dielectric film provided between the first conductive film and the second conductive film,
wherein the dielectric film has a dielectric constant higher than that of the first interlayer insulating film.

6. The semiconductor device according to claim 4,
wherein the first conductive film and the second conductive film are formed of the same material and are formed in a same layer.

7. The semiconductor device according to claim 6, further comprising a contact plug having:
a lower contact plug located between the second conductive film and the source region and electrically coupling the second conductive film to the source region; and
an upper contact plug located over the second conductive film and coupled to the wiring and the second conductive film,
wherein the second conductive film is placed at a height position between a height position of the lower contact plug and a height position of the upper contact plug.

8. The semiconductor device according to claim 6,
wherein either aluminum or an aluminum alloy is used as a material of each of the first conductive film and the second conductive film.

9. The semiconductor device according to claim 1, further comprising a contact plug having:
a lower contact plug located between the wiring and the source region and electrically coupled to the source region; and
an upper contact plug located over the lower contact plug and electrically coupled to the wiring and the lower contact plug,
wherein the first conductive film and the lower contact plug are formed of the same material.

10. The semiconductor device according to claim 9, further comprising a second conductive film placed over the first surface and coupled to the source region,
wherein the second conductive film is opposite to the first conductive film while being insulated therefrom, and
wherein the first conductive film and the second conductive film are formed of the same material and are formed in a same layer.

11. The semiconductor device according to claim 1, further comprising:
a column region provided in the semiconductor substrate, extending in the drift region from the base region toward the second surface, and having the second conductivity type.

12. The semiconductor device according to claim 1,
wherein the wiring is conductively connected to the source region,
the first conductive film is conductively connected to the drain region, and
in an off-state of the semiconductor device, the first conductive film is not conductively connected to the wiring.

13. The semiconductor device according to claim 1, further comprising:
a second wiring over the first surface and conductively connected to the source region via a contact plug that extends between the drift region and the second wiring,
wherein the first conductive film is connected to the second wiring such that the first conductive film is conductively connected to the drain region via the second wiring.

14. The semiconductor device according to claim 1, wherein
a first capacitance is formed between the base region and the drift region,
a second capacitance is formed between the wiring and the first conductive film, and
the first capacitance and the second capacitance act as capacitances in parallel between the source and drain regions.

15. The semiconductor device according to claim 1, further comprising:
a second conductive film electrically coupled to the source region,
wherein a portion of the first conductive film faces a portion of the second conductive film, and
the first and second conductive films are insulated from each other.

16. The semiconductor device according to claim 15, wherein an insulating film separating the facing portions of the first and second conductive films has a dielectric constant that is higher than that of an insulating film between the wiring and the first conductive film or an insulating film between the first conductive film and the source region.

17. The semiconductor device according to claim 15, wherein the first and second conductive films are formed from a same layer and are co-planar.

18. The semiconductor device according to claim 15, wherein a first plug portion couples the source region to the second conductive film, and a second plug portion couples the second conductive film to the wiring, the second conductive film being between the first and second plug portions.

19. The semiconductor device according to claim 15, wherein the first and second conductive films are formed of a material comprising aluminum.

* * * * *